(12) United States Patent
Kiwanami et al.

(10) Patent No.: US 9,232,657 B2
(45) Date of Patent: Jan. 5, 2016

(54) WIRING SUBSTRATE AND MANUFACTURING METHOD OF WIRING SUBSTRATE

(71) Applicant: SHINKO ELECTRIC INDUSTRIES CO., LTD., Nagano-ken (JP)

(72) Inventors: Takayuki Kiwanami, Nagano (JP); Junji Sato, Nagano (JP); Katsuya Fukase, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 47 days.

(21) Appl. No.: 14/291,367

(22) Filed: May 30, 2014

(65) Prior Publication Data

US 2014/0360765 A1 Dec. 11, 2014

(30) Foreign Application Priority Data

Jun. 10, 2013 (JP) ................................ 2013-121871

(51) Int. Cl.
| | |
|---|---|
| H05K 1/00 | (2006.01) |
| H05K 1/03 | (2006.01) |
| H05K 1/16 | (2006.01) |
| H05K 1/18 | (2006.01) |
| H05K 3/46 | (2006.01) |
| H01L 23/498 | (2006.01) |

(52) U.S. Cl.
CPC .......... *H05K 1/185* (2013.01); *H01L 23/49822* (2013.01); *H01L 23/49827* (2013.01); *H01L 23/49816* (2013.01); *H01L 2224/16225* (2013.01); *H01L 2224/32225* (2013.01); *H01L 2224/73204* (2013.01); *H05K 3/4602* (2013.01); *H05K 2201/10636* (2013.01); *H05K 2203/0191* (2013.01)

(58) Field of Classification Search
CPC ................ H05K 1/185; H05K 3/4602; H05K 2201/10636
USPC .......................... 174/255, 258, 260; 361/761
See application file for complete search history.

(56) References Cited

U.S. PATENT DOCUMENTS

| | | | | |
|---|---|---|---|---|
| 2009/0215231 A1* | 8/2009 | Inoue | ................... | H01L 23/5389 438/125 |
| 2010/0059876 A1* | 3/2010 | Shimizu | .............. | H01L 23/5389 257/700 |
| 2010/0300737 A1* | 12/2010 | Sato | .................... | H01L 23/5389 174/260 |

FOREIGN PATENT DOCUMENTS

JP 2011-216740 10/2011

* cited by examiner

*Primary Examiner* — Sherman Ng
(74) *Attorney, Agent, or Firm* — Fish & Richardson P.C.

(57) ABSTRACT

A wiring substrate includes a core, first and second wiring layers formed on opposite sides of the core, an electronic component arranged in a cavity of the core, and a first insulating layer that fills the cavity and covers the one surface of the core. The electronic component is partially buried in the first insulating layer and partially projected from the cavity and exposed from the first insulating layer. A second insulating layer covers the first insulating layer. A third insulating layer covers the core and the projected and exposed portion of the electronic component. The thickness of the third insulating layer where the first wiring layer is located is equal to the total thickness of the first insulating layer and the second insulating layer where the second wiring layer is located.

6 Claims, 14 Drawing Sheets

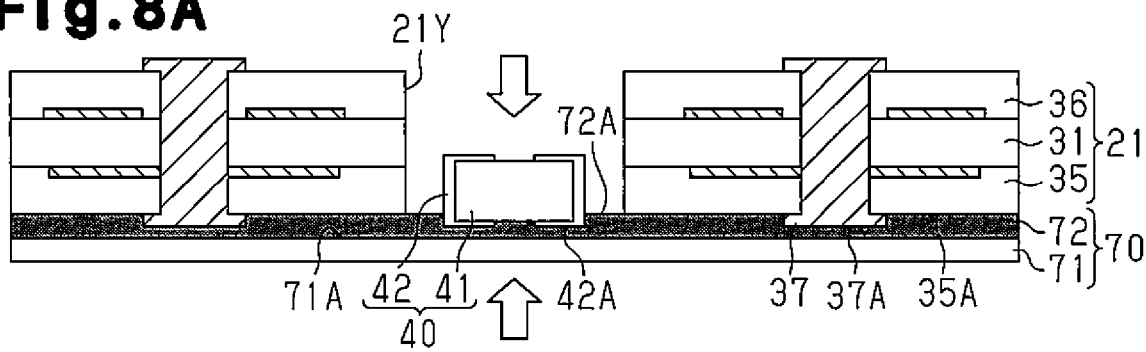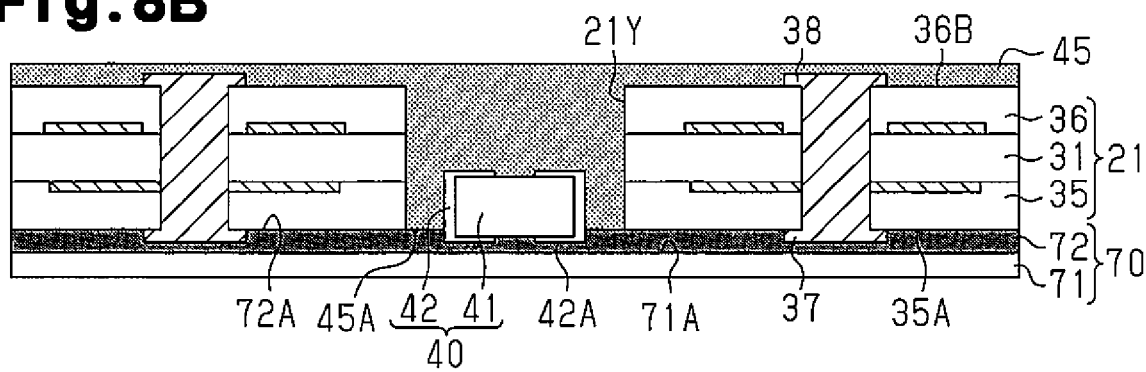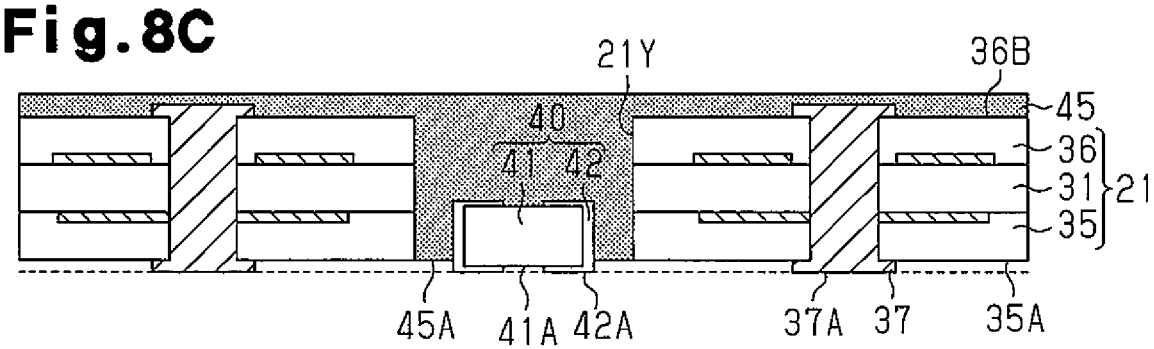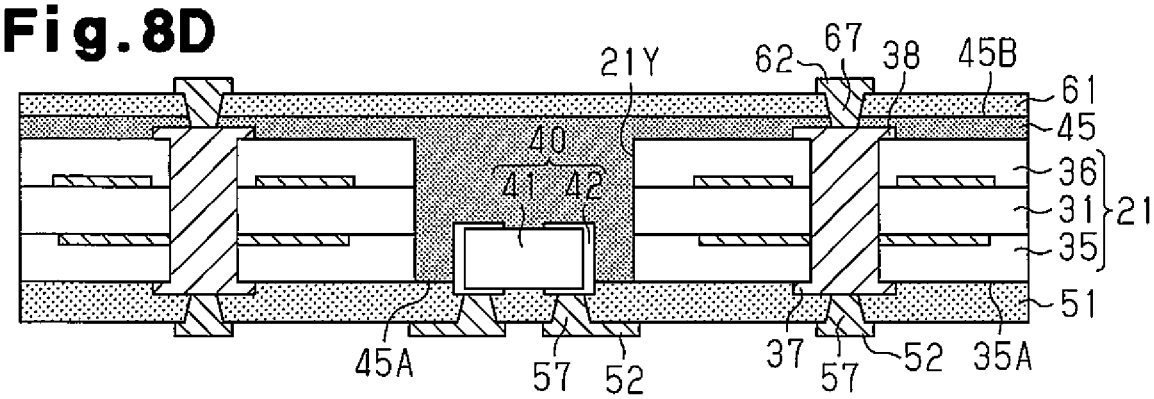

WIRING SUBSTRATE AND MANUFACTURING METHOD OF WIRING SUBSTRATE

CROSS-REFERENCE TO RELATED APPLICATIONS

This application is based upon and claims the benefit of priority from prior Japanese Patent Application No. 2013-121871, filed on Jun. 10, 2013, the entire contents of which are incorporated herein by reference.

FIELD

The present disclosure relates to a wiring substrate and a method for manufacturing a wiring substrate.

BACKGROUND

Japanese Laid-Open Patent Publication No. 2011-216740 describes an example of a wiring substrate incorporating an electronic component such as a semiconductor chip. The wiring substrate includes a core substrate having a cavity, an electronic component arranged in the cavity, and build-up layers formed on the two opposite surfaces of the core substrate. The electronic component is encapsulated in an insulative resin material that fills the cavity. The electronic component is electrically connected to wires in the build-up layers through vias formed in the build-up layers.

A method for manufacturing the wiring substrate will now be described. First, as illustrated in FIG. 15A, a cavity 90X is formed in a core substrate 90. A temporary fastening tape 91 is applied to a lower surface 90A of the core substrate 90 to close the cavity 90X, and an electronic component 92 is arranged on the tape 91 in the cavity 90X. Then, referring to FIG. 15B, vacuum lamination, vacuum hot pressing, or the like is performed to fill the cavity 90X and cover an upper surface 90B of the core substrate 90 with an insulating layer 93. Subsequently, as illustrated in FIG. 15C, the tape 91 is removed from the core substrate 90. Then, as illustrated in FIG. 15D, an insulating layer 94 is stacked on the lower surface 90A of the core substrate 90, to which the tape 91 had been attached. Laser processing, for example, is performed to form via holes VH11 and VH12 in the insulating layers 94 and 93, respectively. Subsequently, a semi-additive process, for example, is performed to form wiring layers 95 and 96. Then, a certain number of insulating layers and wiring layers are stacked on the insulating layers 94 and 93.

SUMMARY

When the volume of the cavity 90X accommodating the electronic component 92 increases, the insulating layer 93 may not be able to sufficiently fill the cavity 90X. In such a case, a recess may form in the insulating layer 93 immediately above the cavity 90X. This may adversely affect the formation of the wiring layer 96 on the insulating layer 93.

One aspect of the present disclosure is a wiring substrate including a core. The core includes a first surface, a second surface, and a cavity. The second surface is located at an opposite side of the first surface. The cavity includes a first opening and a second opening in the first surface and the second surface, respectively. A first wiring layer is formed on the first surface of the core. A second wiring layer is formed on the second surface of the core. An electronic component is arranged in the cavity. A first insulating layer fills the cavity and covers the second surface of the core. The electronic component is partially buried in the first insulating layer, and the electronic component includes a portion projected from the first opening of the cavity and exposed from the first insulating layer. A second insulating layer covers the first insulating layer. A third insulating layer covers the first surface of the core and the projected and exposed portion of the electronic component. A first via wire extends through the third insulating layer. A third wiring layer is formed on the third insulating layer and electrically connected to the electronic component through the first via wire. A second via wire extends through the second insulating layer and the first insulating layer. A fourth wiring layer is formed on the second insulating layer and electrically connected to the second wiring layer through the second via wire. A thickness of the third insulating layer over the first wiring layer is equal to a total thickness of the first insulating layer and the second insulating layer over the second wiring layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 8A to 8D are schematic cross-sectional views illustrating a method for manufacturing a wiring substrate of a first modification;

DETAILED DESCRIPTION OF EMBODIMENTS

Figure 1:
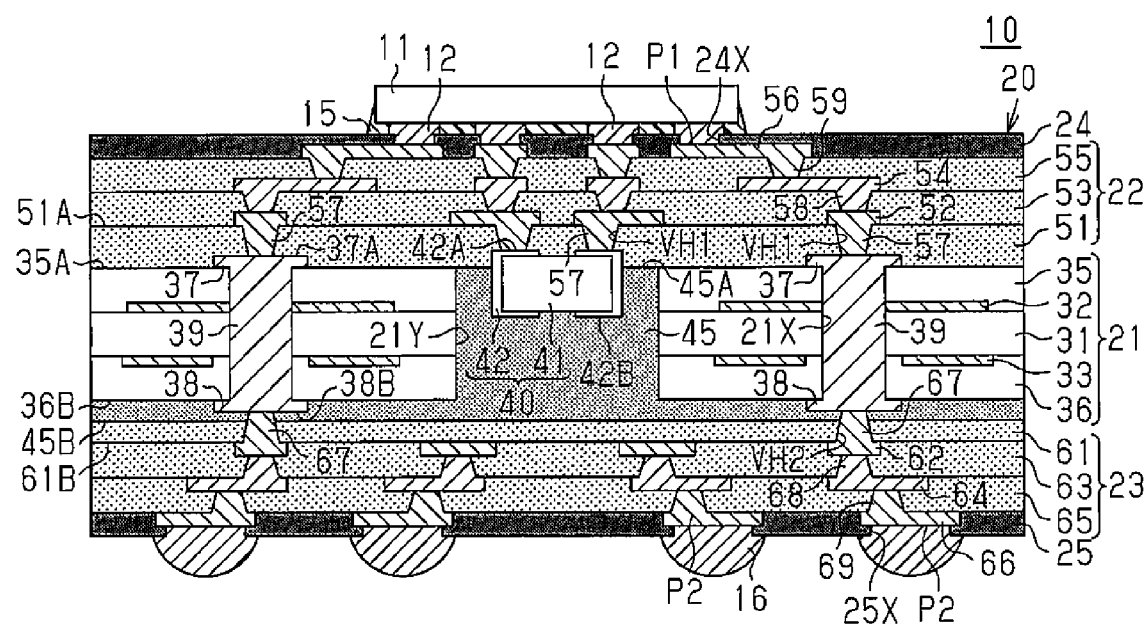
FIG. 1 is a schematic cross-sectional view of a semiconductor device including a wiring substrate of a first embodiment taken along line 1-1 in FIG. 2.

In the drawings, elements are illustrated for simplicity and clarity and have not necessarily been drawn to scale. To facilitate understanding, hatching lines may not be illustrated in the cross-sectional drawings and screentones may be used instead.

A first embodiment will now be described with reference to FIGS. 1 to 5.

As illustrated in FIG. 1, a semiconductor device 10 includes a wiring substrate 20, a semiconductor chip 11 mounted on the wiring substrate 20, and an underfill resin 15 formed in a gap between the wiring substrate 20 and the semiconductor chip 11.

The wiring substrate 20 includes a core 21, a chip capacitor 40 incorporated in the wiring substrate 20, a wiring structure 22 formed on a first surface 35A (e.g., upper surface) of the core 21, an insulating layer 45 that covers a second surface (e.g., lower surface) of the core 21, a wiring structure 23 formed on a second surface 45B of the insulating layer 45, a solder resist layer 24 that covers the wiring structure 22, and a solder resist layer 25 that covers the wiring structure 23.

The core 21 is, for example, a multi-layer printed wiring board. The core 21 includes a core substrate 31, inner wiring layers 32 and 33, insulating layers 35 and 36, outer wiring layers 37 and 38, and through electrodes 39. Each of the outer wiring layers 37 and 38 serve as the outer surface of the core 21. In the illustrated example, the first surface 35A of the core 21 corresponds to the outer surface of the insulating layer 35, and a second surface 36B of the core 21 corresponds to the outer surface of the insulating layer 36. The thickness of the core 21 conforms to the distance from the first surface 35A of the insulating layer 35 to the second surface 36B of the insulating layer 36 and is, for example, about 300 to 800 am.

The core substrate 31 may be a so-called glass epoxy substrate that is formed by impregnating, for example, a glass cloth (glass woven cloth), which is a reinforcement material, with a thermosetting insulative resin, of which the main component is epoxy resin, and then hardening the glass cloth. The reinforcement material is not limited to glass cloth, and may be, for example, glass nonwoven cloth, aramid woven cloth, aramid nonwoven cloth, liquid crystal polymer (LAP) woven cloth, or LAP nonwoven cloth. The thermosetting insulative resin may be an insulative resin other than the epoxy resin such as polyimide resin, cyanide resin, or the like.

The wiring layer 32 is formed on a first surface (e.g., upper surface) of the core substrate 31, and the wiring layer 33 is formed on a second surface (e.g., lower surface) of the core substrate 31. The wiring layers 32 and 33 include, for example, a power line and a ground line. The insulating layer 35 covers the wiring layer 32, which is stacked on the first surface of the core substrate 31. The insulating layer 36 covers the wiring layer 33, which is stacked on the second surface of the core substrate 31. The wiring layers 32 and 33 may be formed from, for example, copper or copper alloy. The insulating layers 35 and 36 may be formed from, for example, an insulative resin such as epoxy resin, polyimide resin, or the like, a composite resin material, in which a filler such as silica, alumina, and the like is mixed with the insulative resin.

Through holes 21X are formed at certain locations (two locations in FIG. 1) in the core 21 (core substrate 31 and insulating layers 35 and 36). Each through hole 21X extends through the core substrate 31 and the insulating layers 35 and 36 in a thicknesswise direction. Each through hole 21X receives one of the through electrodes 39. The through electrode 39 is, for example, rod-shaped. The through electrode 39 has a diameter of, for example, about 50 to 100 µm. The material of the through electrode 39 is, for example, copper or copper alloy.

The wiring layer 37 is formed on the first surface 35A of the insulating layer 35 (first surface 35A of the core 21). The wiring layer 38 is formed on the second surface 36B of the insulating layer 36 (second surface 36B of the core 21). The through electrodes 39 electrically connect the wiring layers 37 and 38.

Figure 2:
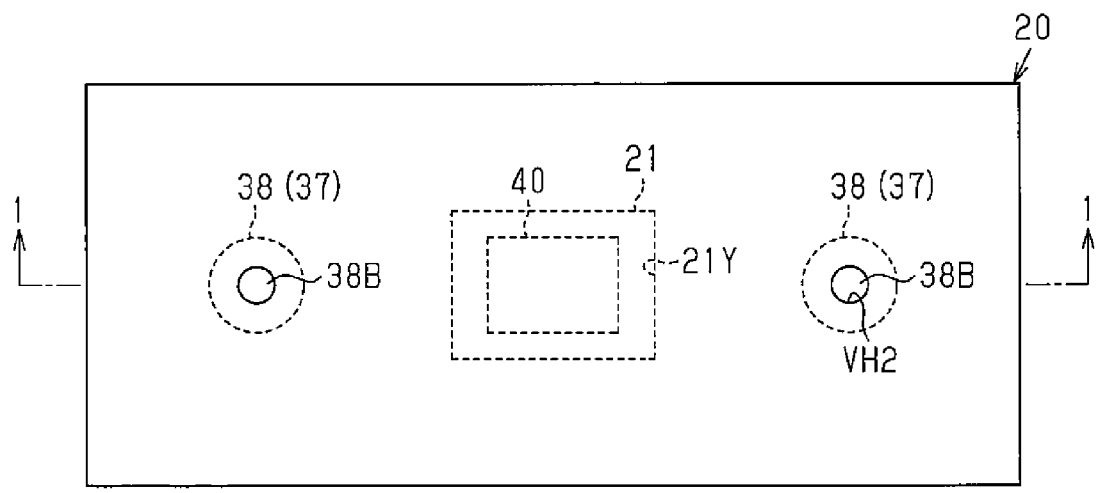
FIG. 2 is a schematic view of a portion of the semiconductor device including the wiring substrate of the first embodiment.

As illustrated in FIG. 2, the wiring layers 37 and 38 are formed to be, for example, substantially circular as viewed from above. The wiring layers 37 and 38 each have a diameter of, for example, about 100 to 150 µm. The wiring layers 37 and 38 each have a thickness of, for example, about 10 to 20 µm. The wiring layers 37 and 38 are formed from, for example, copper or copper alloy. FIG. 2 is a schematic view of the core 21, the chip capacitor 40, and the insulating layer 45 taken from the lower side of FIG. 1.

As illustrated in FIG. 1, the core 21 (core substrate 31 and insulating layers 35, 36) includes a cavity 21Y formed at a certain location (e.g., one location). The cavity 21Y extends through the core 21 (core substrate 31 and insulating layers 35 and 36) in the thicknesswise direction. Further, the cavity 21Y has a first opening in the first surface 35A of the core 21 and a second opening in the second surface 36B of the core 21. The cavity 21Y may be referred to as an accommodation compartment for accommodating the chip capacitor 40.

In the example illustrated in FIG. 2, the cavity 21Y is formed in a central portion of the core 21. The cavity 21Y is shaped in conformance with the chip capacitor 40 and may be, for example, rectangular as viewed from above. The cavity 21Y has a larger footprint than the chip capacitor 40. Thus, the chip capacitor 40 may be arranged away toward the inner side from the wall surface of the cavity 21Y. The cavity 21Y may be, for example, 5 mm×5 mm to 15 mm×15 mm as viewed from above.

As illustrated in FIG. 1, most of the chip capacitor 40 is arranged in the cavity 21Y. The remaining portion of the chip capacitor 40 projects from the first opening of the cavity 21Y into the wiring structure 22. The chip capacitor 40 includes a box-shaped capacitor body 41 and two connection terminals 42, which are formed at the two longitudinal ends of the capacitor body 41. Each connection terminal 42 covers at least a side surface, which includes one end face in the longitudinal direction of the capacitor body 41, a portion of the upper surface, and a portion of the lower surface.

The chip capacitor 40 has a thickness of, for example, 200 to 500 µm. The capacitor body 41 is mainly formed by, for example, an electrode of ceramics, copper, or the like. The connection terminals 42 are formed from, for example, copper or copper alloy.

The chip capacitor 40 projects toward the upper side from the first opening of the cavity 21Y, that is, the core 21, or the first surface 35A of the insulating layer 35. Accordingly, a portion of the capacitor body 41, the entire first surface 42A of the connection terminal 42, and a portion of the side surface of each connection terminal 42 project toward the upper side from the first opening of the cavity 21Y. In the illustrated example, the first surface 42A of each connection terminal 42 is located above the first surface 37A of the wiring layer 37.

The surfaces (e.g., upper surface and side surfaces) of the chip capacitor 40 projecting toward the upper side from the first surface 35A of the insulating layer 35 are rough surfaces. In the preferred example, the surfaces (e.g., upper surface and side surfaces) of the chip capacitor 40 exposed from the insulating layer 45 are rougher than the surfaces of the chip capacitor 40 that are not exposed from the insulating layer 45 (e.g., lower surface and side surfaces).

The cavity 21Y is filled by the insulating layer 45. The insulating layer 45 is filled in the cavity 21Y to cover the chip capacitor 40. For example, the insulating layer 45 covers a second surface (e.g., lower surface) of the capacitor body 41, a second surface 42B (e.g., lower surface) of each connection terminal 42, and portions of the side surfaces of the connection terminals 42. The insulating layer 45 covers the entire second surface 36B of the insulating layer 36 and portions of the wiring layer 38. The first surface 45A (e.g., upper surface) of the insulating layer 45 is substantially flush with the first surface 35A of the insulating layer 35. The material of the insulating layer 45 is preferably an insulative resin having a higher filling capability than an interlayer insulating layer 51 in the wiring structure 22, for example, epoxy resin, polyimide resin, or the like. The thickness from the second surface 38B (e.g., lower surface) of the wiring layer 38 to the second surface 45B (e.g., lower surface) of the insulating layer 45 is, for example, 10 to 15 μm.

The wiring structure 22 is stacked on the first surface 35A of the insulating layer 35. In the wiring structure 22, wiring layers and interlayer insulating layers are alternately stacked. The wiring layer may have any number of layers. The interlayer insulating layer has a thickness that insulates the wiring layers from each other. In the wiring structure 22 of the present example, the interlayer insulating layer 51, a wiring layer 52, an interlayer insulating layer 53, a wiring layer 54, an interlayer insulating layer 55, and a wiring layer 56 are alternately stacked.

The interlayer insulating layer 51 is formed on the insulating layer 35 and the insulating layer 45. The interlayer insulating layer 51 covers the chip capacitor 40 projecting from the insulating layer 45 and the cavity 21Y. Thus, the side surfaces including the longitudinal end faces of the chip capacitor 40 are partially covered by the interlayer insulating layer 51, and the remaining portions are covered by the insulating layer 45. The material of the interlayer insulating layer 51 is preferably an insulative resin having a higher insulating capability than the insulating layer 45, and is, for example, an insulative resin such as epoxy resin or polyimide resin, or a composite resin material in which a filler such as silica, alumina, or the like is mixed with the insulative resin. The thickness from the first surface 37A of the wiring layer 37 to the first surface 51A (e.g., upper surface) of the interlayer insulating layer 51 is, for example, 15 to 35 μm.

The interlayer insulating layer 51 includes via holes VH1 extending through the interlayer insulating layer 51 to expose the first surface 37A of the wiring layer 37 or the first surface 42A of the connection terminal 42. The via holes VH1 may be referred to as first through holes.

The wiring layer 52 is stacked on the interlayer insulating layer 51. The wiring layer 52 is electrically connected to the wiring layer 37 or the connection terminal 42 through via wires 57 filled in the via hole VH1. In other words, the wiring layer 52 is electrically connected to the wiring layer 37 or the connection terminal 42 through the via wires 57 extending through the interlayer insulating layer 51.

In the same manner, the interlayer insulating layer 53 is formed on the interlayer insulating layer 51 to cover the wiring layer 52. The wiring layer 54 is formed on the interlayer insulating layer 53 and electrically connected to the wiring layer 52 through via wires 58 extending through the interlayer insulating layer 53. The interlayer insulating layer 55, which is the outermost layer, is formed on the interlayer insulating layer 53 to cover the wiring layer 54. The outermost wiring layer 56 is formed on the interlayer insulating layer 55 and electrically connected to the wiring layer 54 through via wires 59 extending through the interlayer insulating layer 55.

The via wires 57, 58, and 59 are tapered so that the diameter increases from the lower side (core 21) toward the upper side (wiring layer 56) as viewed in FIG. 1. Each of the via wires 57, 58, and 59 are, for example, shaped into the forms of rods or truncated cones and has a diameter of 50 to 75 μm. Each of the wiring layers 52, 54, 56 has a thickness of, for example, 15 to 35 μm. The thickness from the first surface (e.g., upper surface) of the wiring layer 52 to the first surface (e.g., upper surface) of the interlayer insulating layer 53 and the thickness from the first surface (e.g., upper surface) of the wiring layer 54 to the first surface (e.g., upper surface) of the interlayer insulating layer 55 are, for example, about 15 to 35 μm. The wiring layers 52, 54, and 56 and the via wires 57, 58, and 59 may be formed from, for example, copper or copper alloy. The interlayer insulating layers 53, 55 may be formed from, for example, an insulative resin such as epoxy resin or polyimide resin, or a composite resin material in which a filler such as silica, alumina, and the like is mixed with the insulative resin.

The solder resist layer 24 is stacked on the first surface (e.g., upper surface) of the interlayer insulating layer 55 of the outermost layer (e.g., uppermost layer). The solder resist layer 24 is formed from, for example, an insulative resin such as epoxy resin, acryl resin, or the like. The solder resist layer 24 includes openings 24X exposing portions of the wiring layer 56 of the uppermost layer as pads P1. Each pad P1 is flip-chip connected to a bump 12 of the semiconductor chip 11. In the wiring substrate 20, the surface on which the pads P1 are formed functions as a chip mounting surface.

When necessary, an Organic Solderability Preservative (OSP) process may be performed on the wiring layer 56 exposed from the opening 24X to form an OSP film, and the semiconductor chip 11 may be connected to the OSP film. A metal layer may be formed on the wiring layer 56 exposed from the opening 24X, and the semiconductor chip 11 may be connected to the metal layer. An example of the metal layer includes a gold (Au) layer, a nickel (Ni) layer/Au layer (metal layer in which Ni layer and Au layer are stacked in this order on the wiring layer 56), an Ni layer/palladium (Pd) layer/Au layer (metal layer in which Ni layer, Pd layer, and Au layer are stacked in this order on the wiring layer 56), and the like. The Ni layer, Au layer, and Pd layer may be metal layers (non-electrolytic plating metal layers) formed through a non-electrolytic plating process, for example. The Au layer is a metal layer including Au or Au alloy, the Ni layer is a metal layer including Ni or Ni alloy, and the Pd layer is a metal layer including Pd or Pd alloy.

The wiring structure 23 is stacked on the second surface 45B of the insulating layer 45. In the wiring structure 23, the wiring layer and the interlayer insulating layer are alternately stacked. The wiring layer may have any number of layers. The interlayer insulating layer has a thickness that insulates the wiring layers from each other. In the wiring structure 23 of the present example, an interlayer insulating layer 61, a wiring layer 62, an interlayer insulating layer 63, a wiring layer 64, an interlayer insulating layer 65, and a wiring layer 66 are alternately stacked.

The interlayer insulating layer 61 is formed on the second surface 45B of the insulating layer 45. The interlayer insulating layer 61 is preferably formed from, for example, an insulative resin having a higher insulating capability than the insulating layer 45, and is, for example, an insulative resin such as epoxy resin, polyimide resin, and the like, or a composite resin material in which a filler such as silica, alumina, or the like is mixed with the insulative resin. The thickness from the second surface 38B of the wiring layer 38 to the second surface 61B of the interlayer insulating layer 61 is, for example, set to be the same as the thickness from the first surface 37A of the wiring layer 37 to the first surface 51A of the interlayer insulating layer 51 described above. In other words, the thickness of the insulating layer 45 and thickness of the interlayer insulating layer 61 formed on the wiring layer 38 are set to be the same as the thickness of the interlayer insulating layer 51 formed on the wiring layer 37. For example, the thickness from the second surface 38B of the wiring layer 38 to the second surface 61B of the interlayer insulating layer 61 is set to about 15 to 35 μm. The thickness from the second surface 45B of the insulating layer 45 to the second surface 61B of the interlayer insulating layer 61 is, for example, about 10 to 20 μm.

Via holes VH2 extend through the interlayer insulating layer 61 and the insulating layer 45 in the thicknesswise direction to expose the second surface 38B of the wiring layer 38. The via holes VH2 may be referred to as second through holes.

The wiring layer 62 is stacked on the second surface 61B of the interlayer insulating layer 61. The wiring layer 62 is electrically connected to the wiring layer 38 through via wires 67 filled in the via holes VH2. The wiring layer 62 is electrically connected to the wiring layer 38 through the via wires 67 extending through the interlayer insulating layer 61 and the insulating layer 45.

In the same manner, the interlayer insulating layer 63 is formed on the second surface 61B of the interlayer insulating layer 61 so as to cover the wiring layer 62. The wiring layer 64 is formed on the second surface (e.g., lower surface) of the interlayer insulating layer 63 and is electrically connected to the wiring layer 62 through via wires 68 extending through the interlayer insulating layer 63. The interlayer insulating layer 65, which is the outermost layer, is formed on the second surface of the interlayer insulating layer 63 to cover the wiring layer 64. The wiring layer 66 of the outermost layer is formed on the second surface (e.g., lower surface) of the interlayer insulating layer 65 and electrically connected to the wiring layer 64 through via wires 69 extending through the interlayer insulating layer 65.

The via wires 67, 68, and 69 are tapered so that the diameter increases from the upper side (core 21) toward the lower side (wiring layer 66) as viewed in FIG. 1. Each of the via wires 67, 68, and 69 are, for example, shaped into the forms of rods or truncated cones and has a diameter of 50 to 75 μm. The thickness of the wiring layers 62, 64, 66 is, for example, 15 to 35 μm. The thickness from the second surface of the wiring layer 62 to the second surface of the interlayer insulating layer 63 and the thickness from the second surface of the wiring layer 64 to the second surface of the interlayer insulating layer 65 are, for example, about 15 to 35 μm. The wiring layers 62, 64, and 66 and the via wires 67, 68, 69 may be formed from, for example, copper or copper alloy. The interlayer insulating layers 63, 65 may be formed from, for example, an insulative resin such as epoxy resin, polyimide resin, and the like, or a composite resin material in which a filler such as silica, alumina, and the like is mixed with the insulative resin.

The solder resist layer 25 is stacked on the second surface of the interlayer insulating layer 65, which is the outermost layer (e.g., lowermost layer). The solder resist layer 25 may be formed from, for example, an insulative resin such as epoxy resin, acryl resin, and the like. The solder resist layer 25 includes openings 25X that expose portions of the second surface (e.g., lower surface) of the wiring layer 66 of the lowermost layer as external connection pads P2. Each external connection pad P2 is connected to an external connection terminal 16 such as a solder ball, a lead pin, and the like that is used when mounting the semiconductor device 10 to a mounting substrate such as a motherboard, and the like. When necessary, an OSP process may be performed on the wiring layer 66 exposed from the openings 25X to form an OSP film, and the external connection terminals 16 may be connected to the OSP film. A metal layer may be formed on the wiring layer 66 exposed from the openings 25X, and the external connection terminals 16 may be connected to the metal layer. An example of the metal layer includes an Au layer, a Ni layer/Au layer (metal layer in which Ni layer and Au layer are stacked in this order on the second surface of the wiring layer 66), an Ni layer/Pd layer/Au layer (metal layer in which Ni layer, Pd layer, and Au layer are stacked in this order on the second surface of the wiring layer 66), and the like. The wiring layer 66 (OSP film or metal layer when the OSP film and the metal layer are formed on the wiring layer 66) exposed from the openings 25X may function as the external connection terminals.

The semiconductor chip 11 is flip-chip mounted on the wiring substrate 20. In other words, the bumps 12 arranged on the circuit forming surface (lower surface in FIG. 1) of the semiconductor chip 11 are joined with the pads P1 of the wiring substrate 20. The bumps 12 electrically connect the semiconductor chip 11 to the wiring layer 56 of the wiring substrate 20.

The semiconductor chip 11 may be, for example, a logic chip such as a Central Processing Unit (CPU) chip, a Graphics Processing Unit (GPU) chip, or the like. Further, the semiconductor chip 11 may be, for example, a memory chip such as a Dynamic Random Access Memory (DRAM) chip, a Static Random Access Memory (SRAM) chip, a flash memory chip, or the like. The size of the semiconductor chip 11 may be, for example, about 3 mm×3 mm to 12 mm×12 mm as viewed from above. The semiconductor chip 11 has a thickness of, for example, about 50 to 100 μm.

Each bump 12 may be, for example, a gold bump or a solder bump. The solder bump may be formed from, for example, an alloy containing lead (Pb), alloy of tin (Sn) and Au, alloy of Sn and Cu, alloy of Sn and Ag, alloy of Sn, Ag, and Cu, or the like.

The underfill resin 15 fills the gap between the first surface (e.g., upper surface) of the wiring substrate 20 and the second surface (e.g., lower surface) of the semiconductor chip 11. The underfill resin 15 may be formed from, for example, an insulative resin such as epoxy resin or the like.

The operation of the semiconductor device 10 will now be described.

The interlayer insulating layer 61 is stacked on the second surface 45B of the insulating layer 45 that fills the cavity 21Y of the core 21. The wiring layer 62 connected to the wiring layer 38 through the via wires 67, which extend through the insulating layer 45 and the interlayer insulating layer 61, is stacked on the interlayer insulating layer 61. Thus, even if an increase in the volume of the cavity 21Y hinders sufficient filling of the cavity 21Y with the insulating layer 45 and forms, for example, a recess in the second surface 45B of the insulating layer 45, the recess in the insulating layer 45 may be filled by the interlayer insulating layer 61. In other words, the recess formed in the second surface 45B of the insulating layer 45 may be absorbed by the interlayer insulating layer 61. This flattens the second surface 61B of the interlayer insulating layer 61, that is, the outer surface of the insulating layer that covers the wiring layer 38.

The side surfaces of the chip capacitor 40 are covered by the insulating layer 45 and the interlayer insulating layer 51. This allows the insulating layer 45, which fills the cavity 21Y, and the interlayer insulating layer 51, which insulates the connection terminals 42, and the wiring layer 37, to be formed with materials having different properties. For example, an insulative resin having a high filling capability may be used as the material of the insulating layer 45, and highly insulative and rigid resin may be used as the material of the interlayer insulating layer 51. Accordingly, the interlayer insulating layer 51 may obtain sufficient insulation between the connection terminals 42 and the wiring layer 37, while the insulating layer 45 obtains a high capability for filling the cavity 21Y.

In the chip capacitor 40, the first surface 42A and portions of the side surfaces of the connection terminals 42 are projected toward the upper side from the first surface 35A of the core 21 and exposed from the insulating layer 45. The surface of the chip capacitor 40 exposed from the insulating layer 45 is a rough surface. This increase the area of contact between the chip capacitor 40 and the interlayer insulating layer 51 compared to when the surface of the chip capacitor 40 exposed from the insulating layer 45 is a smooth surface and when only the first surface 42A of the connection terminal 42 is exposed from the insulating layer 45. Thus, the adhesiveness may be increased between the chip capacitor 40 and the interlayer insulating layer 51.

Further, the side surfaces of the connection terminals 42 exposed from the insulating layer 45 increases the exposed area of the connection terminals 42 as compared to when only the first surface 42A of the connection terminal 42 is exposed from the insulating layer 45. This increases the tolerable displacement amount of each via hole VH1 formed in the interlayer insulating layer 51 and thus facilitates the formation of the via holes VH1.

A method for manufacturing the wiring substrate 20 will now be described.

Figure 3A:
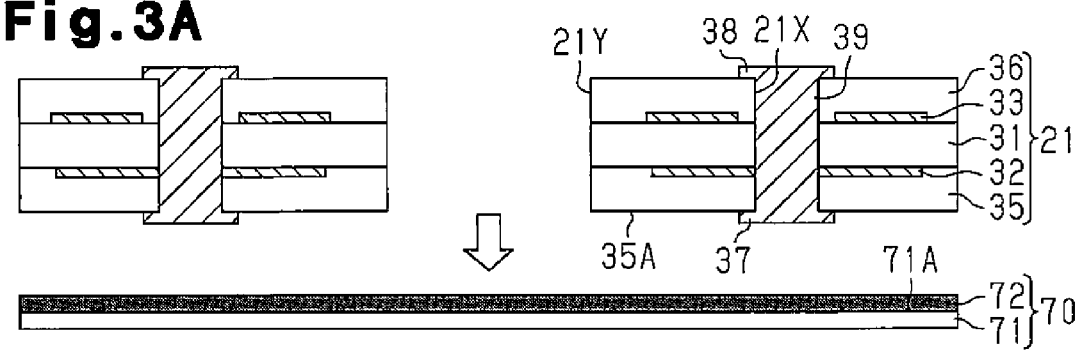
FIGS. 3A to 3E are schematic cross-sectional views illustrating a method for manufacturing the wiring substrate of the first embodiment.

As illustrated in FIG. 3A, the core 21 that includes the cavity 21Y is prepared. The core 21 may be manufactured, for example, as described below. Using the known art, a printed wiring board may be formed including the core substrate 31 and the wiring layers 32 and 33 and the insulating layers 35 and 36 respectively formed on the first surface (e.g., lower surface) and the second surface (e.g., upper surface) of the core substrate 31, the wiring layers 37 and 38 respectively formed on the outer surfaces of the insulating layers 35 and 36, and the through electrodes 39. Then, the cavity 21Y is formed to open at locations corresponding to the mounting position of the chip capacitor 40 (see FIG. 1) in the formed printed wiring board. This completes the core 21. The cavity 21Y may be formed, for example, by performing router processing, die processing that uses a die, laser processing, drilling, or the like.

As illustrated in FIG. 3A, an adhesive sheet or an adhesive tape 70 including a film or a tape base 71 and an adhesive layer 72 applied to an upper surface 71A of the tape base 71 is prepared. The tape 70 is preferably formed from, for example, a material having superior heat resistance and/or satisfactory workability. The tape base 71 may be, for example, a polyimide resin film or a polyester resin film. The adhesive layer 72 is preferably easily removable from the insulating layer 35 of the core 21 and the insulating layer 45 (see FIG. 1), which is subsequently formed. The adhesive layer 72 may be, for example, an acrylic, silicon, or olefin adhesive material. The tape base 71 has a thickness of, for example, about 30 to 50 μm. The adhesive layer 72 has a thickness of, for example, 15 to 35 μm.

As illustrated in FIG. 3A, the tape 70 is arranged on the first surface 35A of the core 21, that is, the first surface side of the insulating layer 35. In this case, the tape 70 is arranged with the adhesive layer 72 facing upward so that the adhesive layer 72 faces the core 21.

Figure 3B:
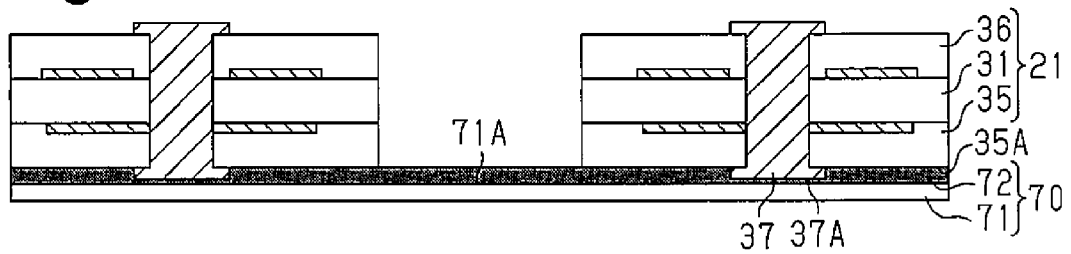

Then, as illustrated in FIG. 3B, the tape 70 is applied on the first surface 35A of the core 21. For example, the adhesive layer 72 of the tape 70 is applied to the first surface 35A of the insulating layer 35. For example, the adhesive tape 70 is laminated to the first surface 35A of the insulating layer 35 through thermal compression bonding. In this case, the wiring layer 37 formed on the first surface 35A of the insulating layer 35 is embedded in the adhesive layer 72. In the present example, however, the first surface 37A (e.g., lower surface) of the wiring layer 37 does not contact the upper surface 71A of the tape base 71. In other words, the wiring layer 37 is buried in the adhesive layer 72 so that the first surface 37A is located in the middle of the adhesive layer 72 in the thicknesswise direction.

Figure 3C:
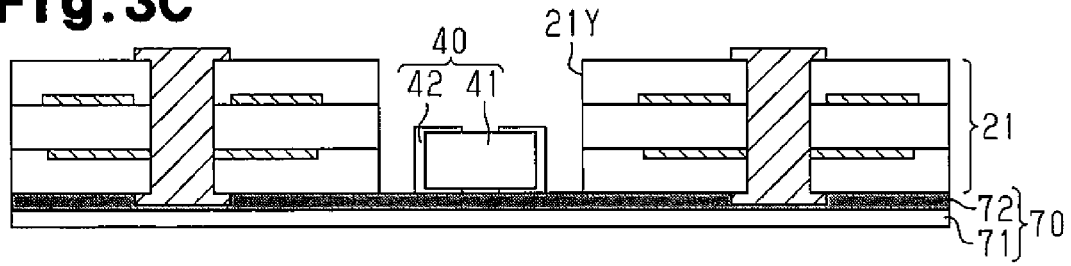

Then, as illustrated in FIG. 3C, using, for example, a mounter, the chip capacitor 40 is mounted on the adhesive layer 72 of the tape 70 exposed in the cavity 21Y of the core 21.

Figure 3D:
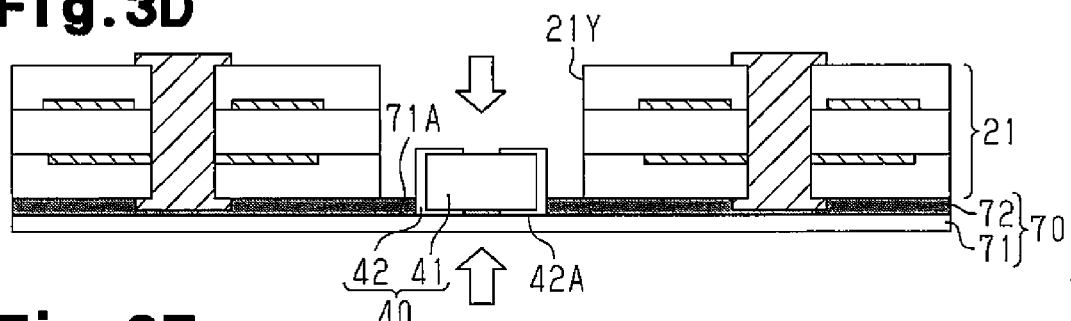

Subsequently, as illustrated in FIG. 3D, the chip capacitor 40 is pushed against the tape 70 (adhesive layer 72) to bury a portion of the chip capacitor 40 in the adhesive layer 72. In the present step, the chip capacitor 40 is pushed against the tape 70 until the first surface 42A (e.g., lower surface) of each connection terminal 42 of the chip capacitor 40 contacts the upper surface 71A of the tape base 71. Thus, the adhesive layer 72 does not contact the first surface 42A of each connection terminal 42. Further, the portion of the chip capacitor 40 that is not buried in the adhesive layer 72 is arranged in the cavity 21Y.

Figure 3E:
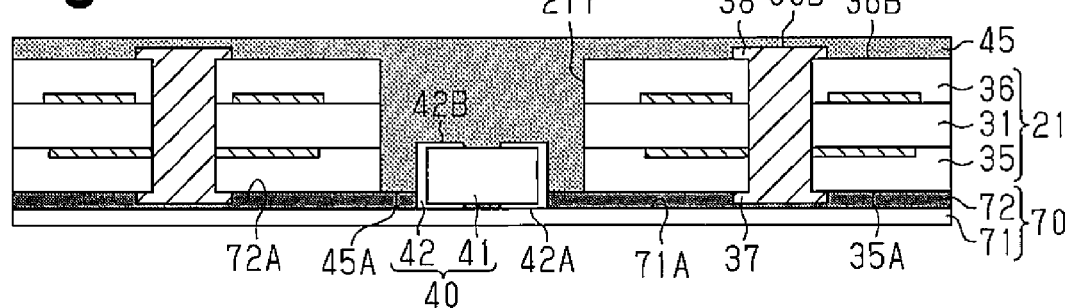

Then, referring to FIG. 3E, the insulating layer 45 that fills the cavity 21Y and covers the second surface 36B of the insulating layer 36 and the wiring layer 38 is formed by performing, for example, a vacuum lamination process or vacuum pressing. The chip capacitor 40 is entirely covered in the cavity 21Y by the insulating layer 45 filled in the cavity 21Y. In this case, the cavity 21Y is filled with resin that forms the insulating layer 45. Thus, the pressure of the resin flowing into the cavity 21Y may easily displace or tilt the chip capacitor 40. In the present example, however, a portion of the chip capacitor 40 is buried in the adhesive layer 72. This prevents or reduces displacement or the like of the chip capacitor 40 caused by the pressure of the resin flowing into the cavity 21Y.

Figure 4A:
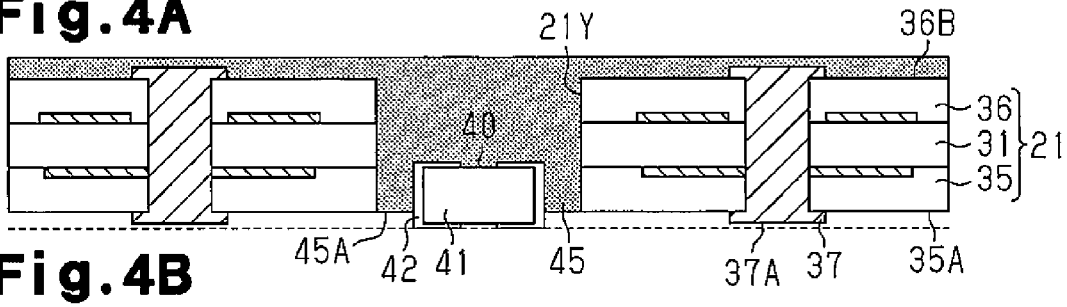
FIGS. 4A and 4C to 4E are schematic cross-sectional views illustrating the method for manufacturing the wiring substrate of the first embodiment.
Figure 4B:
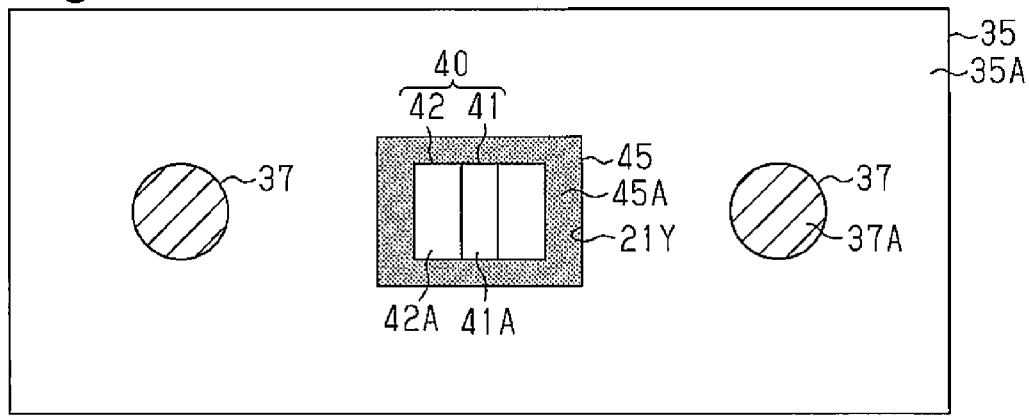
FIG. 4B is a schematic plan view illustrating the method for manufacturing the wiring substrate of the first embodiment.

Then, referring to FIG. 4A, the tape 70 (tape base 71 and adhesive layer 72) is removed from the core 21. In this case, the tape base 71 is in contact with the first surface 42A of each connection terminal 42 and the adhesive layer 72 is not in contact with the connection terminals 42. This prevents or reduces the formation of a so-called adhesive deposit in which the adhesive layer 72 remains on the first surface 42A of the connection terminal 42 after removal of the tape 70. When the tape 70 is removed in the present step, each connection terminal 42 of the chip capacitor 40 is partially projected from the first opening of the cavity 21Y in the first surface 35A of the core 21 and exposed from the insulating layer 45, as illustrated in FIG. 4A. The first surface 35A of the insulating layer 35 and the first surface 45A (e.g., lower surface) of the insulating layer 45 that was in contact with the upper surface 72A of the adhesive layer 72 in the step of FIG. 3D are formed to extend along the upper surface 72A (flat surface) of the adhesive layer 72. Thus, the first surface 35A of the insulating layer 35 and the first surface 45A of the insulating layer 45 are flat and substantially in flush with each other. Accordingly, in the present step, the side surfaces of the chip capacitor 40 projecting toward the lower side from the first surface 35A of the core 21 is exposed from the insulating layer 45. Further, in the present step, the first surface 41A of the capacitor body 41 and the first surface 42A of each connection terminal 42 are exposed from the insulating layer 45, as illustrated in FIG. 4B. Moreover, in the present example, the first surface 42A of each connection terminal 42 is lower than the first surface 37A of the wiring layer 37, as illustrated in FIG. 4A (refer to broken lines).

Subsequently, a roughening process is performed on the wiring layer 37 and the connection terminals 42 exposed from the insulating layers 35 and 45. The roughening process is performed to set the surface roughness Ra of the wiring layer 37 and the surfaces (e.g., lower surface and side surface) of each connection terminal 42 to about 0.5 to 2 μm. The surface roughness Ra is also referred to as the arithmetic average roughness, which is an arithmetic average value of the height (absolute value) from the average surface level measured at various positions within a predetermined measurement region. In the present step, fine pits and valleys are formed in the wiring layer 37 and the surfaces of each connection terminal 42 to roughen the wiring layer 37 and the surface of the connection terminal 42. The roughening process is performed so that the interlayer insulating layer 51 is easily adhered to the wiring layer 37 and the connection terminal 42 in the next step illustrated in FIG. 4C. The roughening process may be, for example, an etching process, a CZ process, a blackening process (oxidation process), and a sandblast process. The roughening process eliminates the residual of the removed tape 70 from the wiring layer 37 and the surfaces (e.g., lower surface and side surfaces) of each connection terminal 42.

Figure 4C:
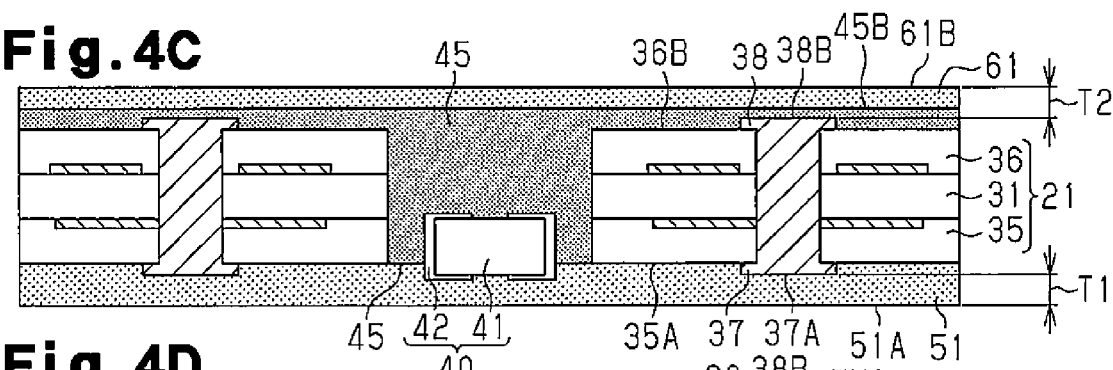

Then, as illustrated in FIG. 4C, the interlayer insulating layer 51 is formed covering the entire first surface 35A of the insulating layer 35, the entire first surface 45A of the insulating layer 45, the first surface 37A and the side surfaces of the wiring layer 37, and the entire surface of the chip capacitor 40 exposed from the insulating layer 45. At the same time, the interlayer insulating layer 61 is formed covering the entire second surface 45B (e.g., upper surface) of the insulating layer 45. The interlayer insulating layer 51 may be formed, for example, by laminating the resin film on the first surfaces 35A and 45A of the insulating layers 35 and 45, and then thermally processing and curing the resin film at a temperature of about 130° C. to 200° C. while pressing the resin film. In the same manner, the interlayer insulating layer 61 may be formed, for example, by laminating the resin film on the second surface 45B of the insulating layer 45, and then thermally processing and curing the resin film at a temperature of between about 130 and 200° C. while pressing the resin film. In this case, the thickness of the interlayer insulating layer 51 and the thickness of the interlayer insulating layer 61 are set so that the thickness T1 from the first surface 37A of the wiring layer 37 to the first surface 51A (e.g., lower surface) of the interlayer insulating layer 51 is substantially equal to the thickness T2 from the second surface 38B of the wiring layer 38 to the second surface 61B (e.g., upper surface) of the interlayer insulating layer 61. For example, when the thickness from the second surface 38B of the wiring layer 38 to the second surface 45B of the insulating layer 45 is 10 μm and the thickness of each of the wiring layers 37 and 38 is 10 μm, the thickness of the interlayer insulating layer 51 is set to 35 μm and the thickness of the interlayer insulating layer 61 is set to 15 μm. The thickness T1 and the thickness T2 are thus both about 25 μm. By setting the thickness T1 to be the same as the thickness T2, the handling characteristics for forming wiring layers in subsequent steps may be improved.

In the present step, a further insulating layer, namely, the interlayer insulating layer 61, is formed on the insulating layer 45 to flatten the outer surface of the insulating layer that covers the wiring layer 38. For example, in FIG. 3E, an increase in the volume of the cavity 21Y hinders sufficient filling of the cavity 21Y with the insulating layer 45. This may form a recess in the insulating layer 45 above the cavity 21Y. In the present example, even when such a recess is formed, the interlayer insulating layer 61 formed on the insulating layer 45 fills the recess. This flattens the outer surface of the insulating layer that covers the wiring layer 38, namely, the second surface 61B of the interlayer insulating layer 61. Thus, a fine wire may be formed on the interlayer insulating layer 61.

Figure 4D:
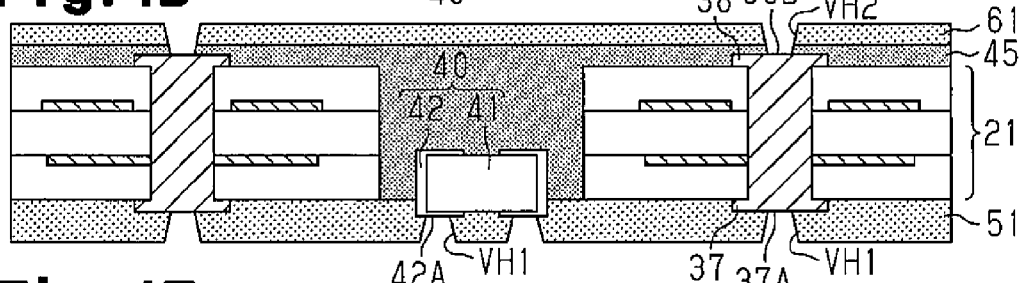

Then, as illustrated in FIG. 4D, the via holes VH1 are formed at certain locations in the interlayer insulating layer 51 to expose portions of the first surface 37A of the wiring layer 37 and portions of the first surface 42A of the connection terminal 42. The via holes VH2, which extend through the interlayer insulating layer 61 and the insulating layer 45, are formed at predetermined locations of the interlayer insulating layer 61 and the insulating layer 45 to expose portions of the second surface 38B of the wiring layer 38. The via holes VH1 and VH2 may be formed through laser processing using, for example, $CO_2$ laser, UV-YAG laser, or like. If the insulating layer 45 and the interlayer insulating layers 51 and 61 are formed using a photosensitive resin, for example, the via holes VH1, VH2 may be formed through photolithography.

When the via holes VH1 and VH2 are formed in a laser processing method, a desmear process is carried out to remove resin smear from the surfaces of the wiring layers 37 and 38 and the connection terminals 42 exposed at the bottom of the via holes VH1, VH2.

Figure 4E:
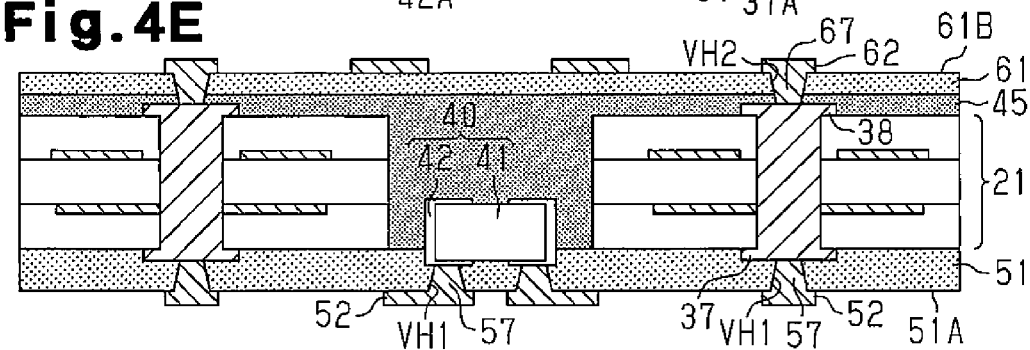

Then, as illustrated in FIG. 4E, the via wires 57 are formed in the via holes VH1, and the wiring layer 52 electrically connected to the wiring layer 37 or the connection terminal 42 through the via wires 57 is stacked on the first surface 51A of the interlayer insulating layer 51. Further, the via wires 67 are formed in the via holes VH2, and the wiring layer 62 electrically connected to the wiring layer 38 through the via wires 67 is stacked on the second surface 61B of the interlayer insulating layer 61. The via wires 57 and 67 and the wiring layers 52 and 62 may be formed using various wire formation methods such as a semi-additive process, a subtractive process, or the like.

Figure 5A:
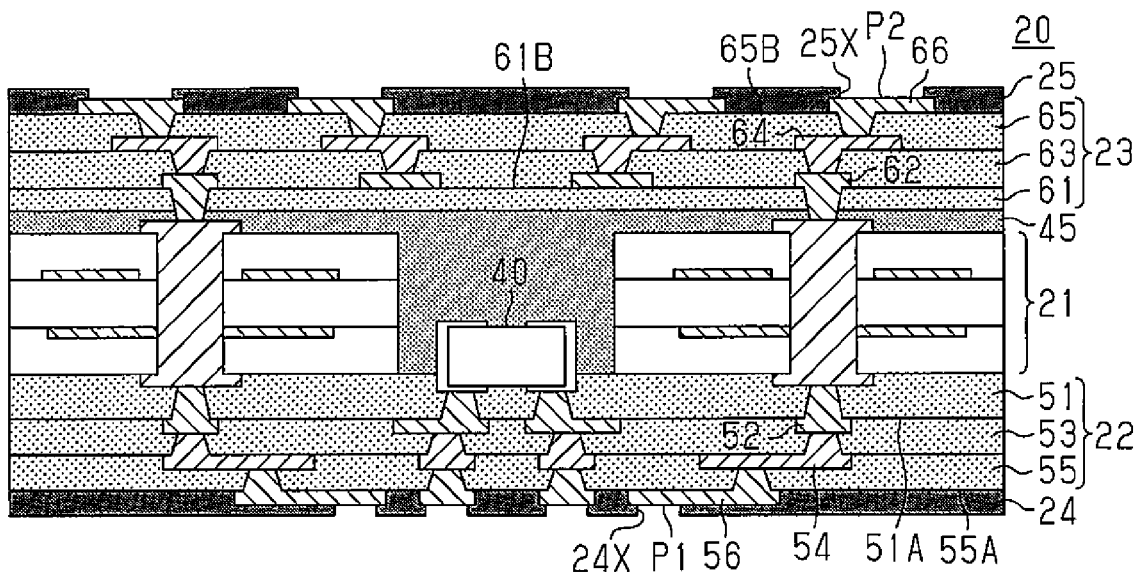
FIG. 5A is a schematic cross-sectional view illustrating the method for manufacturing the wiring substrate of the first embodiment.

Then, as illustrated in FIG. 5A, the procedures of FIGS. 4C to 4E are repeated to alternately stack the interlayer insulating layers 53 and 55 and the wiring layers 54 and 56 on the first surface 51A of the interlayer insulating layer 51, and to alternately stack the interlayer insulating layers 63 and 65 and the wiring layers 62 and 64 on the second surface 61B of the interlayer insulating layer 61.

Subsequently, the solder resist layer 24 including the openings 24X for exposing the pads P1, formed at certain locations in the wiring layer 56, is stacked on the first surface 55A (e.g., lower surface) of the interlayer insulating layer 55. The solder resist layer 25 including the openings 25X for exposing the external connection pads P2 formed at certain locations in the wiring layer 66 is stacked on the second surface 65B (e.g., upper surface) of the interlayer insulating layer 65. The solder resist layers 24 and 25 may be formed, for example, by laminating a photosensitive solder resist film or applying a liquid solder resist and then patterning the resist to a certain shape. This exposes portions of the wiring layer 56 from the openings 24X of the solder resist layer 24 as the pads P1. This also exposes portions of the wiring layer 66 from the openings 25X of the solder resist layer 25 as the external connection pads P2. When necessary, a metal layer in which, for example, an Ni layer and an Au layer are stacked in this order may be formed on the pads P1 and the external connection pads P2. Such a metal layer may be formed, for example, through a non-electrolytic plating method. The wiring substrate 20 of FIG. 1 is manufactured through the above manufacturing steps.

A method for manufacturing the semiconductor device 10 will now be described with reference to FIG. 5B. The structure illustrated in FIG. 5B is reversed upside down from the structure illustrated in FIG. 5A.

Figure 5B:
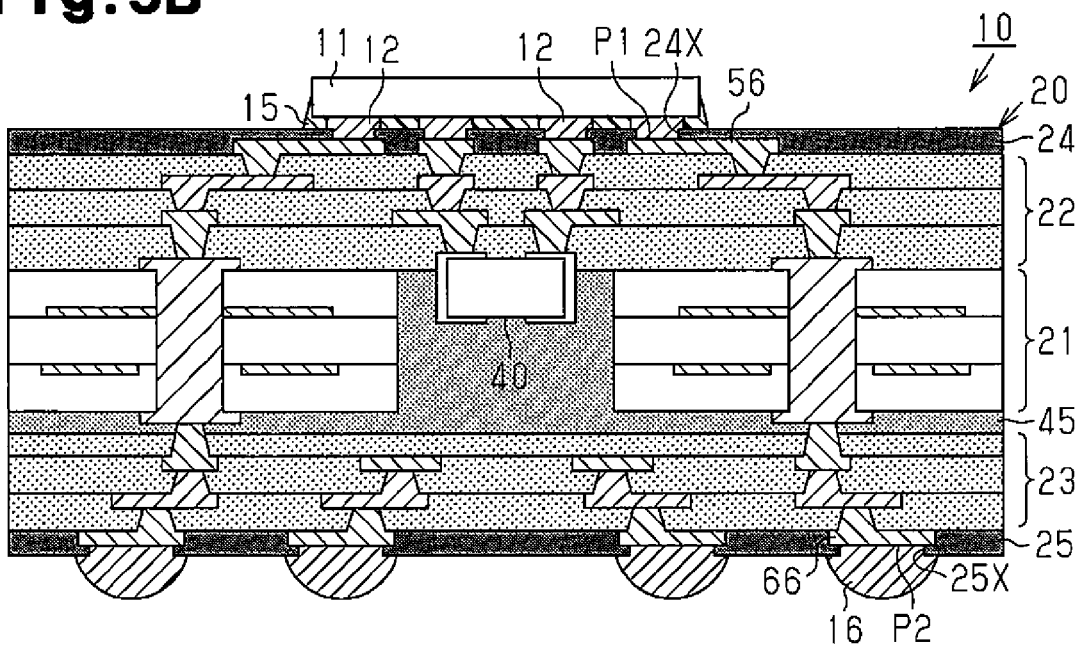
FIG. 5B is a schematic cross-sectional view illustrating a method for manufacturing a semiconductor device including the wiring substrate of the first embodiment.

As illustrated in FIG. 5B, the semiconductor chip 11 is first mounted on the wiring substrate 20, which is manufactured as described above. For example, the bumps 12 of the semiconductor chip 11 are flip-chip joined with the pads P1 of the wiring substrate 20. Then, the underfill resin 15 is filled and cured between the wiring substrate 20 and the semiconductor chip 11 that are flip-chip joined. The external connection terminals 16 are formed on the external connection pads P2. For example, after applying flux to the external connection pads P2, the external connection terminal 16 (e.g., solder ball) are mounted on the external connection pads P2 and fixed by performing a reflow process at temperature of 240° C. to 260° C. Then, the surface is washed to remove the flux.

The semiconductor device 10 of FIG. 1 is manufactured through the manufacturing steps described above.

The first embodiment has the advantages described above.

(1) The cavity 21Y of the core 21 is filled with the insulating layer 45. The interlayer insulating layer 61 is stacked on the second surface 45B of the insulating layer 45. The wiring layer 62, which is connected to the wiring layer 38 through the via wires 67 extending through the insulating layer 45 and the interlayer insulating layer 61, is stacked on the interlayer insulating layer 61. This flattens the second surface 61B of the interlayer insulating layer 61, that is, the outer surface of the insulating layer that covers the wiring layer 38. Accordingly, the fine wiring layer 62 is formed on the second surface 61B of the interlayer insulating layer 61.

(2) The side surfaces of the chip capacitor 40 are covered by the insulating layer 45 and the interlayer insulating layer 51. Thus, the insulating layer 45 that fills the cavity 21Y and the interlayer insulating layer 51 that insulates the connection terminal 42 and the wiring layer 37 may formed by materials having different properties. Thus, the interlayer insulating layer 51 sufficiently insulates the connection terminals 42 and the wiring layer 37, and the insulating layer 45 has a high capability for filling the cavity 21Y.

(3) The first surface 42A and portions of the side surfaces of the connection terminal 42 of the chip capacitor 40 are projected toward the upper side from the first surface 35A of the core 21 and exposed from the insulating layer 45. The surface of the chip capacitor 40 exposed from the insulating layer 45 is roughened. This increases the area of contact between the chip capacitor 40 and the interlayer insulating layer 51 compared to when the surface of the chip capacitor 40 exposed from the insulating layer 45 is a smooth surface and when only the first surface 42A of the connection terminal 42 is exposed from the insulating layer 45. Thus, the adhesiveness is improved between the chip capacitor 40 and the interlayer insulating layer 51.

Further, compared to when only the first surface 42A of each connection terminal 42 is exposed from the insulating layer 45, the portions of the side surfaces of the connection terminals 42 exposed from the insulating layer 45 increases the exposed area of the connection terminals 42. This increases the tolerable displacement amount of each via hole VH1 formed in the interlayer insulating layer 51 and facilitates the formation of the via holes VH1.

(4) The thickness T1 from the first surface 37A of the wiring layer 37 to the first surface 51A of the interlayer insulating layer 51 is set to be substantially the same as the thickness T2 from the second surface 38B of the wiring layer 38 to the second surface 61B of the interlayer insulating layer 61. This improves the handling property of the structure during the manufacturing process.

(5) The cavity 21Y is filled with the insulating layer 45 after a portion of the chip capacitor 40 is buried in the adhesive layer 72 of the tape 70. This prevents or reduces displacement of the chip capacitor 40 or the like caused by the pressure of the resin that flows into and fills the cavity 21Y. This improves the connection reliability of the chip capacitor 40 and the via wires 57.

(6) In the method for manufacturing the conventional semiconductor device illustrated in FIG. 15, displacement of the electronic component 92 and the like when filling the cavity 90X with the insulating layer 93 is prevented or reduced by strengthening the adhesive force (adhesion strength) of the tape 91. In such a case, however, removal of the tape 91 from the core substrate 90 may form the so-called adhesive deposit in which the adhesive layer 91A that fixes the tape 91 remains on the lower surface of a connection terminal of the electronic component 92, as illustrated in FIG. 15C. Such an adhesive deposit adversely affects the electrical connection of the electronic component 92 and the wiring layer 95, as illustrated in FIG. 15D.

In this regards, in the present example, the first surface 42A of the connection terminal 42 of the chip capacitor 40 is in contact with the upper surface 71A of the tape base 71. Thus, during removal of the tape 70 (tape base 71 and adhesive layer 72), the tape base 71 is in contact with the first surface 42A of each connection terminal 42 and the adhesive layer 72 is not in contact with the first surface 42A of each connection terminal 42. This prevents or reduces the formation of the so-called adhesive deposit in which the adhesive layer 72 remains on the first surface 42A of the connection terminal 42 after removal of the tape 70. This allows for satisfactory electrical connection of the chip capacitor 40 and the wiring layer 52 (via wires 57).

(7) In the method for manufacturing the conventional semiconductor device illustrated in FIG. 15, the heat history differs between the insulating layer 93, which fills the cavity 90X and covers the upper surface 90B of the core substrate 90, and the insulating layer 94, which covers the lower surface 90A of the core substrate 90 after removal of the tape 91. More specifically, the insulating layer 93 is exposed to the heat once such as during thermal curing, whereas the insulating layer 94 is exposed to heat twice such as during thermal curing. The difference in the heat history between the insulating layers 93 and 94 results in different surface conditions between the insulating layers 93 and 94 located above and below the core substrate 90. This results in variations in the conditions for forming the wiring layers on the insulating layers 93 and 94.

In this regards, in the present example, the interlayer insulating layer 51 on the first side of the core 21 and the interlayer insulating layer 61 on the second side of the core 21 are simultaneously formed after removal of the tape 70. Thus, the interlayer insulating layers 51 and 61, which are formed above and below the core 21, have the same heat history. In this manner, the wiring layers 52 and 62 on the interlayer insulating layers 51 and 61 are formed under uniform conditions. Accordingly, the wiring layers 52 and 62 are formed on the interlayer insulating layers 51 and 61.

A second embodiment will now be described with reference to FIGS. 6 and 7. Like or same reference numerals are given to those components that are the same as the corresponding components of the first embodiment. Such components will not be described in detail.

A method for manufacturing the semiconductor device 10 in a second embodiment will now be described.

Figure 6A:
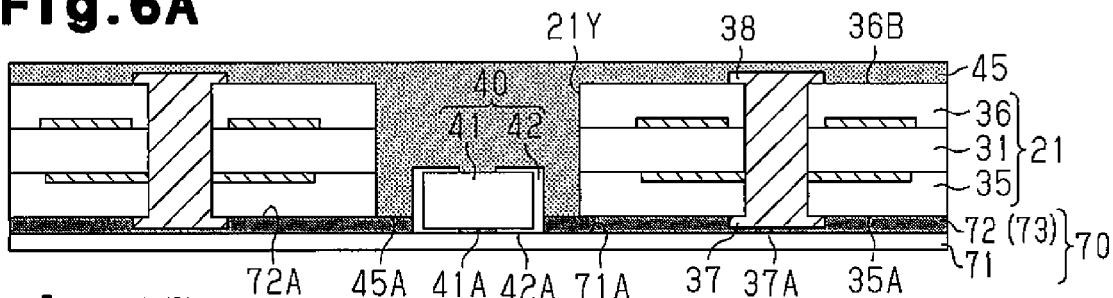
FIGS. 6A to 6E are schematic cross-sectional views illustrating a method for manufacturing a wiring substrate of a second embodiment.

First, as illustrated in FIG. 6A, the procedures of FIGS. 3A to 3E are performed to obtain the structure illustrated in FIG. 6A. For example, the adhesive layer 72 of the tape 70 is an adhesive insulating layer. The adhesive layer 72, for example, may be made of the same material as the interlayer insulating layer 51 of FIG. 1, or may be made of an insulative resin such as epoxy resin or the like.

The adhesive layer 72 is then thermally cured in, for example, a thermal curing process, to form an insulating layer 73. In this case, the insulating layer 73 covers the first surface 41A and the side surface of the capacitor body 41 exposed from the insulating layer 45, the side surfaces of the connection terminals 42 exposed from the insulating layer 45, the first surface 37A and the side surfaces of the wiring layer 37, and the first surfaces 35A and 45A of the insulating layers 35 and 45.

Figure 6B:
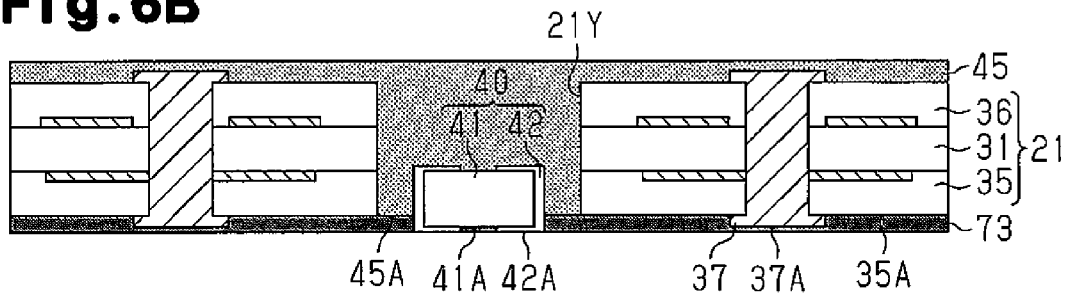

Then, as illustrated in FIG. 6B, the tape base 71 is removed from the core 21. More specifically, only the tape base 71 is removed from the structure of FIG. 6A, and the insulating layer 73 (adhesive layer 72) is kept adhered to the insulating layer 35 of the core 21. Thus, the first surface 35A of the insulating layer 35, the first surface 45A of the insulating layer 45, and the first surface 37A and the side surface of the wiring layer 37 are covered by the insulating layer 73. Further, the side surfaces of the chip capacitor 40 exposed from the insulating layer 45 and the first surface 41A of the capacitor body 41 are covered by the insulating layer 73. In FIG. 6A, the upper surface 71A of the tape base 71 is in contact with the first surface 42A of each connection terminal 42, and the adhesive layer 72 is not in contact with the first surface 42A of each connection terminal 42. Thus, the removal of the tape base 71 exposes the first surface 42A of each connection terminal 42.

A roughening process is performed on the first surface 42A of each connection terminal 42 exposed from the insulating layer 73. The roughening process facilitates adhesion of the interlayer insulating layer 51 to the connection terminal 42 in the following step illustrated in FIG. 6C. The roughening process eliminates the residual of the removed tape base 71 from the first surface 42A of each connection terminal 42.

Figure 6C:
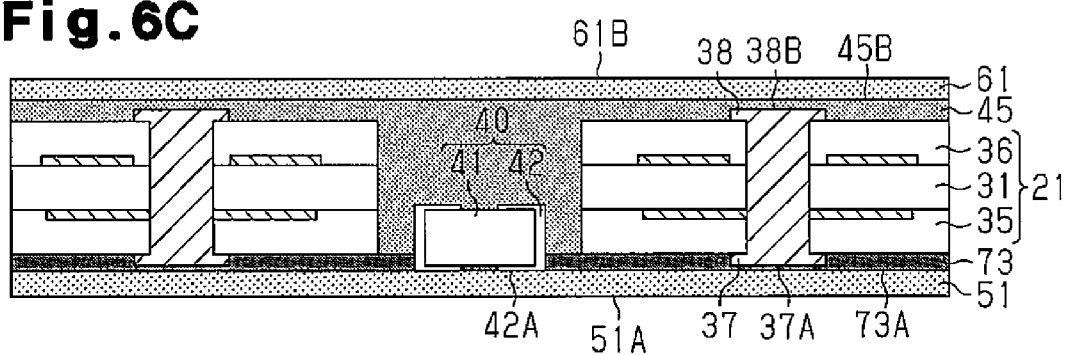

As illustrated in FIG. 6C, the interlayer insulating layer 51 that covers the entire first surface 73A (e.g., lower surface) of the insulating layer 73 and the entire first surface 42A of the connection terminal 42 is formed, and the interlayer insulating layer 61 that covers the entire second surface 45B of the insulating layer 45 is formed. The thickness of each of the interlayer insulating layers 51 and 61 is set so that the thickness from the first surface 37A of the wiring layer 37 to the first surface 51A of the interlayer insulating layer 51 is substantially equal to the thickness from the second surface 38B of the wiring layer 38 to the second surface 61B of the interlayer insulating layer 61. In the second embodiment, the insulating layer 73 and the interlayer insulating layer 51 are examples of the third insulating layer.

In this manner, in the present example, under a situation in which the adhesive layer 72 (insulating layer 73) is not removed and the insulating layer 73 remains adhered to the core 21, a further insulating layer, namely, the interlayer insulating layer 51, is stacked on the first surface 73A of the insulating layer 73. This omits the step for removing the adhesive layer 72 and obviates the formation of an adhesive deposit. Thus, an adhesive deposit is not formed even when the adhesive force of the adhesive layer 72 is increased. Accordingly, displacement of the chip capacitor 40 or the like when filling the cavity 21Y with the insulating layer 45 may be prevented or reduced by increasing the adhesion of the adhesive layer 72.

Figure 6D:
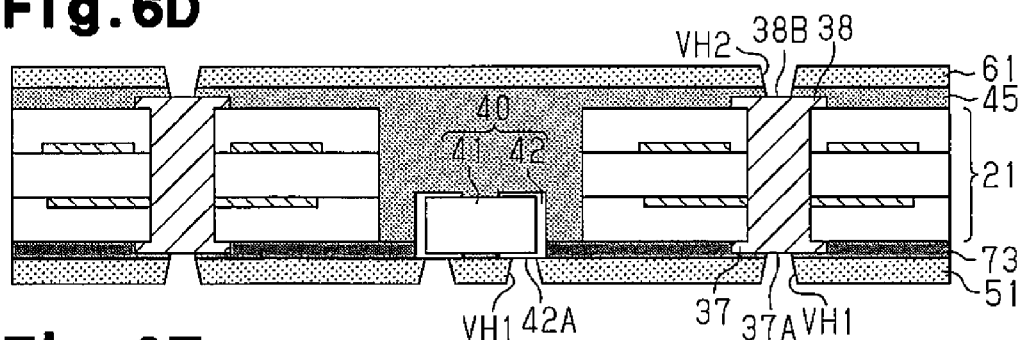

Then, referring to FIG. 6D, for example, laser processing is performed to form the via holes VH1 in predetermined locations of the insulating layer 73 and the interlayer insulating layer 51 to expose portions of the first surface 37A of the wiring layer 37 or portions of the first surface 42A of the connection terminal 42. For example, laser processing is performed to form the via holes VH2 extending through the insulating layer 45 and the interlayer insulating layer 61 at predetermined locations in the insulating layer 45 and the interlayer insulating layer 61 to expose portions of the second surface 38B of the wiring layer 38.

Figure 6E:
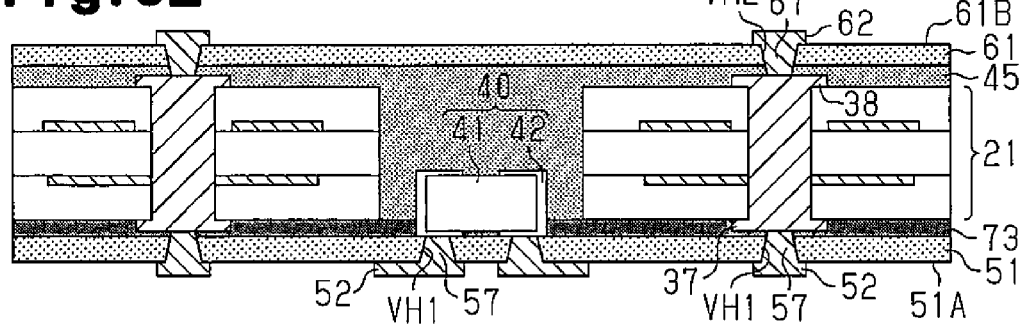

As illustrated in FIG. 6E, the via wires 57 are formed in the via holes VH1. For example, a semi-additive process is performed to stack the wiring layer 52, which is electrically connected to the wiring layer 37 or the connection terminal 42 through the via wires 57, on the first surface 51A of the interlayer insulating layer 51. The via wires 67 are formed in the via holes VH2. For example, a semi-additive process is performed to stack the wiring layer 62, which is electrically connected to the wiring layer 38 through the via wires 67, is stacked on the second surface 61B of the interlayer insulating layer 61.

Figure 7A:
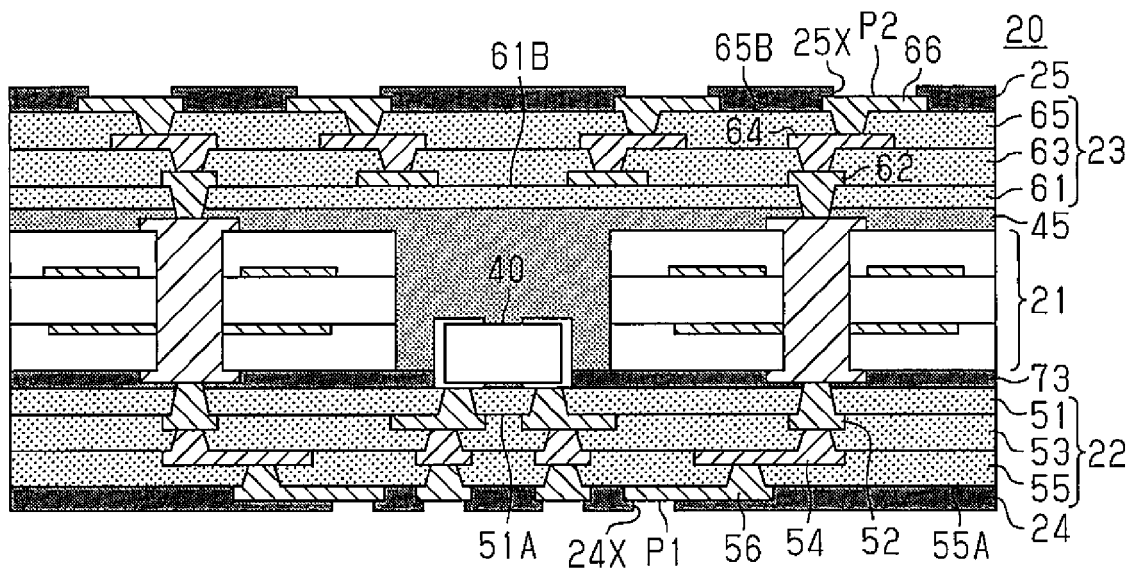
FIG. 7A is a schematic cross-sectional view illustrating the method for manufacturing the wiring substrate of the second embodiment.

As illustrated in FIG. 7A, the procedures of FIGS. 6C to 6E are repeated to alternately stack the interlayer insulating layers 53 and 55 and the wiring layers 54 and 56 on the first surface 51A of the interlayer insulating layer 51. The interlayer insulating layers 63 and 65 and the wiring layers 64 and 66 are alternately stacked on the second surface 61B of the interlayer insulating layer 61. Then, the solder resist layer 24 including the openings 24X are stacked on the first surface 55A of the interlayer insulating layer 55, and the solder resist layer 25 including the openings 25X is stacked on the second surface 65B of the interlayer insulating layer 65. The wiring substrate 20 in the second embodiment is manufactured through the above manufacturing steps.

Figure 7B:
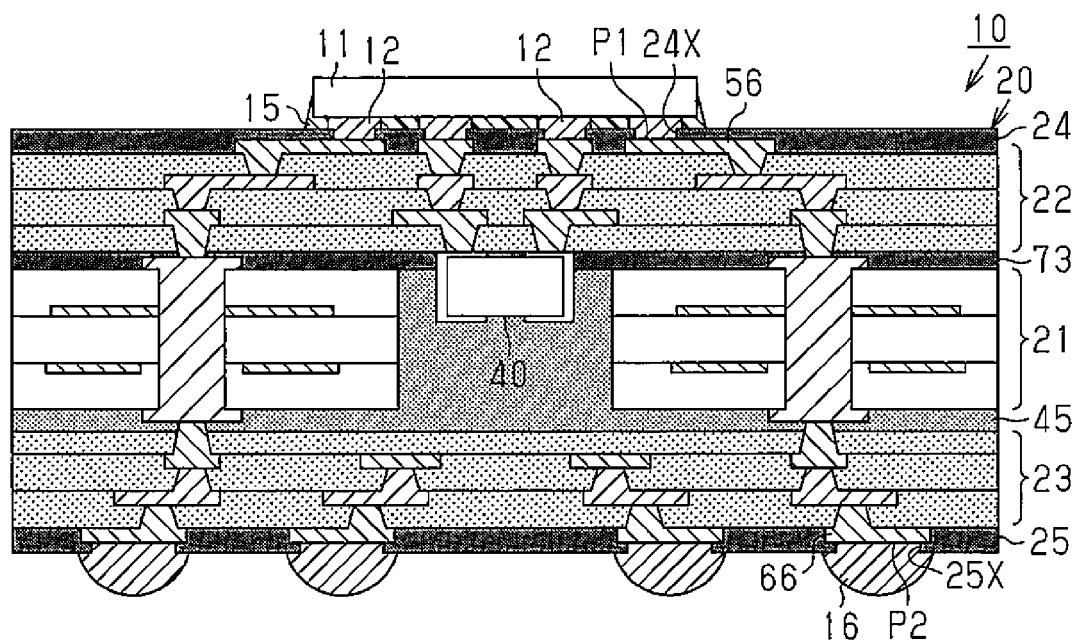
FIG. 7B is a schematic cross-sectional view illustrating a method for manufacturing a semiconductor device including the wiring substrate of the second embodiment.

As illustrated in FIG. 7B, the semiconductor chip 11 is then flip-chip mounted on the wiring substrate 20, which is manufactured as described above, and the underfill resin 15 is formed between the wiring substrate 20 and the semiconductor chip 11. The external connection terminal 16 is formed on each external connection pad P2. The semiconductor device 10 of the second embodiment is manufactured through the above manufacturing steps.

The second embodiment has the following advantage in addition to advantages (1) to (5) and (7) of the first embodiment.

(8) Under a situation in which the adhesive layer 72 (insulating layer 73) is not removed and the insulating layer 73 remains adhered to the core 21, a further insulating layer, namely, the interlayer insulating layer 51, is stacked on the first surface 73A of the insulating layer 73. This omits the step for removing the adhesive layer 72 and obviates the formation of an adhesive deposit. Thus, an adhesive deposit is not formed even when the adhesive force of the adhesive layer 72 is increased. Accordingly, displacement of the chip capacitor 40 or the like when performing the step of FIG. 6A may be prevented or reduced by increasing the adhesion of the adhesive layer 72.

It should be apparent to those skilled in the art that the present invention may be embodied in many other specific forms without departing from the spirit or scope of the invention. Particularly, it should be understood that the present invention may be embodied in the following forms.

In the above embodiments, the first surface 42A of each connection terminal 42 of the chip capacitor 40 is projected in a direction opposite to the second surface 36B of the core 21 from the first surface 37A of the wiring layer 37. Instead, for example, the first surface 42A of each connection terminal 42 may be flush with the first surface 37A of the wiring layer 37. Such a wiring substrate may be formed, for example, as described below.

First, referring to FIG. 8A, the procedures of FIGS. 3A to 3C are performed to apply the tape 70 to the first surface 35A of the core 21 and mount the chip capacitor 40 on the adhesive layer 72 exposed in the cavity 21Y of the core 21. Then, the chip capacitor 40 is pushed against the adhesive layer 72 to bury a portion of the chip capacitor 40 in the adhesive layer 72. In the present step, the first surface 42A (e.g., lower surface) of each connection terminal 42 of the chip capacitor 40 is not in contact with the upper surface 71A of the tape base 71. In other words, the chip capacitor 40 is buried in the adhesive layer 72 so that the first surface 42A of each connection terminal 42 is located in the middle of the adhesive layer 72 in the thicknesswise direction. For example, the chip capacitor 40 is buried in the adhesive layer 72 so that the first surface 42A of each connection terminal 42 is flush with the first surface 37A of the wiring layer 37.

Then, referring to FIG. 8B, the insulating layer 45 that fills the cavity 21Y and covers the second surface 36B of the insulating layer 36 and the wiring layer 38 is formed by performing, for example, a vacuum lamination process or vacuum pressing in the same manner as the procedure of FIG. 3E. In the cavity 21Y, resin that forms the insulating layer 45 is filled in the cavity 21Y. Thus, the chip capacitor 40 may be easily displaced or tilted by the pressure of the resin flowing into the cavity 21Y. In the present example, however, a portion of the chip capacitor 40 is buried in the adhesive layer 72. This prevents or reduces displacement or tilting of the chip capacitor 40 that would be caused by the pressure of the resin flowing into and filling the cavity 21Y.

As illustrated in FIG. 8C, the tape 70 is then removed from the core 21. The connection terminal 42 is projected to the lower side from the first surface 35A of the core 21. The first surface 42A of each connection terminal 42 is substantially flush with the first surface 37A of the wiring layer 37. In the present step, among the tape base 71 and the adhesive layer 72, only the tape base 71 is removed in the same manner as the second embodiment.

A roughening process is then performed on the wiring layer 37 and the connection terminals 42 exposed from the insulating layers 35 and 45.

As illustrated in FIG. 8D, the interlayer insulating layer 51, which covers the wiring layer 37 and the chip capacitor 40 exposed from the insulating layers 35 and 45, is formed on the first surfaces 35A and 45A of the insulating layers 35 and 45 in the same manner as the procedure of FIG. 4C. At the same time, the interlayer insulating layer 61 is formed covering the second surface 45B of the insulating layer 45. Then, the wiring layer 52 is formed connected to the wiring layer 37 or the connection terminal 42 through the via wires 57, which extend through the interlayer insulating layer 51 in the thicknesswise direction, in the same manner as the procedures of FIGS. 4D and 4E. At the same time, the wiring layer 62 is formed connected to the wiring layer 38 through the via wires 67, which extend through the insulating layer 45 and the interlayer insulating layer 61 in the thicknesswise direction.

Subsequently, the procedures of FIGS. 5A and 5B are performed to manufacture the wiring substrate and the semiconductor device of the present modification.

In the above embodiments and the modification, the first surface 37A of the wiring layer 37 is not in contact with the upper surface 71A of the tape base 71 when applying the tape 70 to the first surface 35A of the core 21.

Figure 9A:
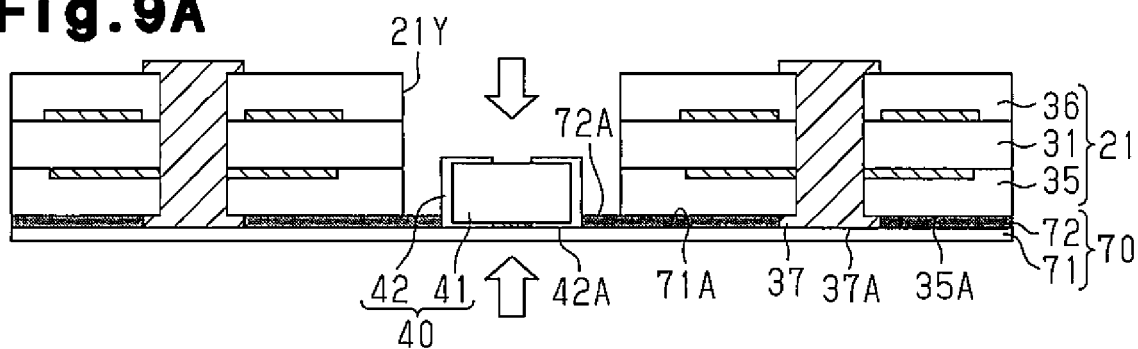
FIGS. 9A to 9D are schematic cross-sectional views illustrating a method for manufacturing a wiring substrate of a second modification.

Instead, referring to FIG. 9A, the tape 70 may be applied to the first surface 35A of the core 21 so that the first surface 37A of the wiring layer 37 contacts the upper surface 71A of the tape base 71. In the present example, the first surface 42A of each connection terminal 42 also contacts the upper surface 71A of the tape base 71. Thus, the adhesive layer 72 is not in contact with the first surface 37A of the wiring layer 37 and the first surface 42A of each connection terminal 42. Further, the first surface 42A of each connection terminal 42 is flush with the first surface 37A of the wiring layer 37. The subsequent steps will now be briefly described.

Figure 9B:
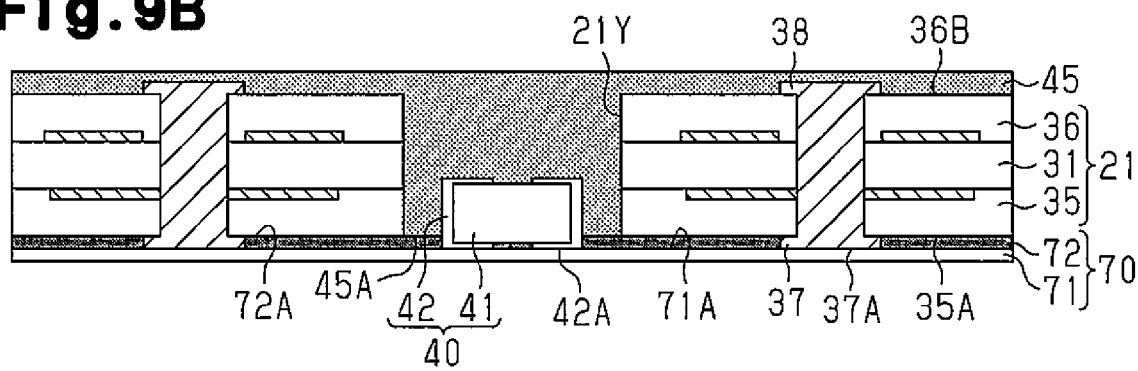
Figure 9C:
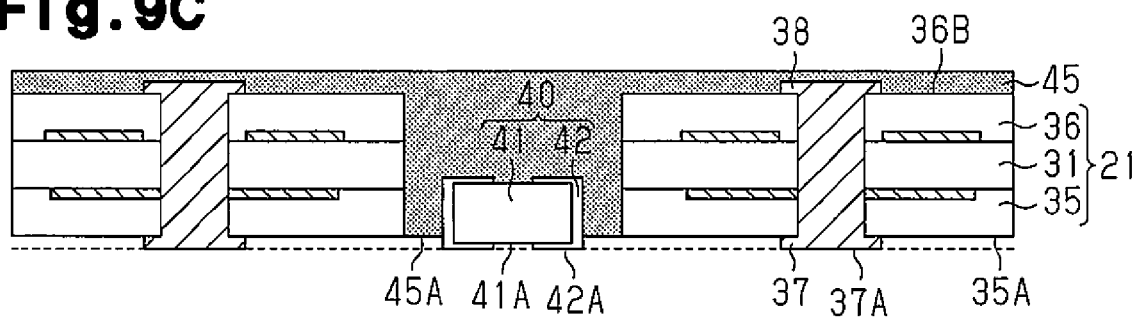

Referring to FIG. 9B, the insulating layer 45 that fills the cavity 21Y and that covers the second surface 36B of the insulating layer 36 and the wiring layer 38 is formed by performing, for example, a vacuum lamination process or vacuum pressing in the same manner as the procedure of FIG. 3E. Then, as illustrated in FIG. 9C, the tape 70 is removed from the core 21. Here, the adhesive layer 72 is not in contact with the first surfaces 37A and 42A of the wiring layer 37 and the connection terminals 42 in the preceding step. This prevents or reduces the formation of adhesive deposits on the first surfaces 37A and 32A. In the present step, among the tape base 71 and the adhesive layer 72, only the tape base 71 is removed in the same manner as the second embodiment.

Then, a roughening process is performed on the wiring layer 37 and the connection terminal 42, which are exposed from the insulating layers 35 and 45.

Figure 9D:
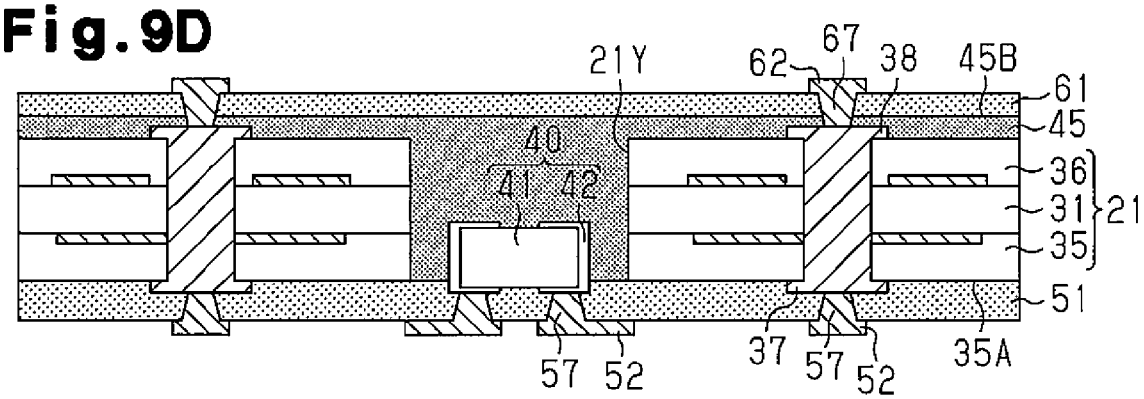

As illustrated in FIG. 9D, the interlayer insulating layer 51 is formed on the first surfaces 35A, 45A of the insulating layers 35 and 45 to cover the wiring layer 37 and the chip capacitor 40, which are exposed from the insulating layers 35 and 45, in the same manner as the procedure of FIG. 4C. At the same time, the interlayer insulating layer 61 that covers the second surface 45B of the insulating layer 45 is formed. Then, the wiring layer 52 is formed connected to the wiring layer 37 or the connection terminal 42 through the via wires 57, which extend through the interlayer insulating layer 51 in the thicknesswise direction, in the same manner as the procedures of FIGS. 4D and 4E. At the same time, the wiring layer 62 is formed connected to the wiring layer 38 through the via wires 67, which extend through the insulating layer 45 and the interlayer insulating layer 61 in the thicknesswise direction.

Then, the procedures of FIGS. 5A and 5B are performed. This manufactures the wiring substrate and the semiconductor device of the present modification.

In the above embodiments and modifications, the tape 70 is applied to the first surface 35A of the insulating layer 35, and the wiring layer 37 is buried in the adhesive layer 72.

Figure 10A:
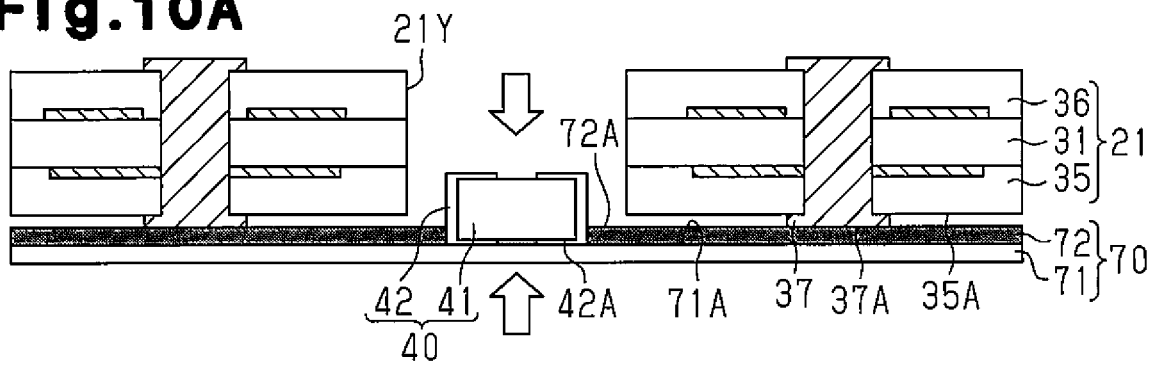
FIGS. 10A to 10D are schematic cross-sectional views illustrating a method for manufacturing a wiring substrate of a third modification.

Instead, referring to FIG. 10A, the adhesive layer 72 may be applied to the first surface 37A of the wiring layer 37. In this case, the adhesive layer 72 is brought into contact with only the first surface 37A of the wiring layer 37, contacts the first surface 35A of the core 21 (i.e., first surface 35A of the insulating layer 35). Thus, a gap (space) is formed between the insulating layer 35 and the adhesive layer 72. In the present example, the chip capacitor 40 is buried in the adhesive layer 72 until the first surface 42A of each connection terminal 42 contacts the upper surface 71A of the tape base 71.

Figure 10B:
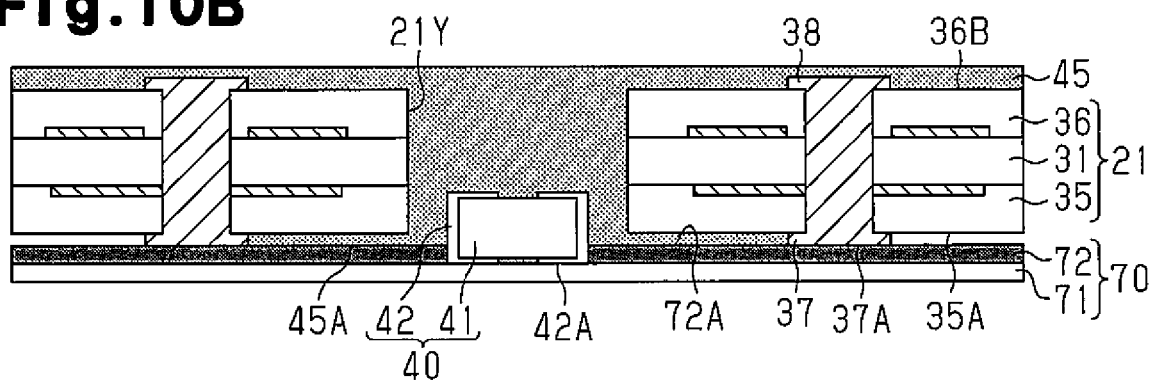

Referring to FIG. 10B, the insulating layer 45 that fills the cavity 21Y and covers the second surface 36B of the insulating layer 36 and the wiring layer 38 is formed by performing, for example, vacuum lamination or vacuum pressing in the same manner as the procedure of FIG. 3E. In this case, a gap is formed between the insulating layer 35 and the adhesive layer 72 as described above. Thus, the insulating layer 45 is also formed in at least a portion of the gap. In other words, at least a portion of the first surface 35A of the insulating layer 35 is covered by the insulating layer 45. In the present example, the insulating layer 45 is filled in the space formed by the side surfaces of the wiring layer 37, the first surface 35A of the insulating layer 35 formed toward the inner side from the wiring layer 37, and the upper surface 72A of the adhesive layer 72.

Figure 10C:
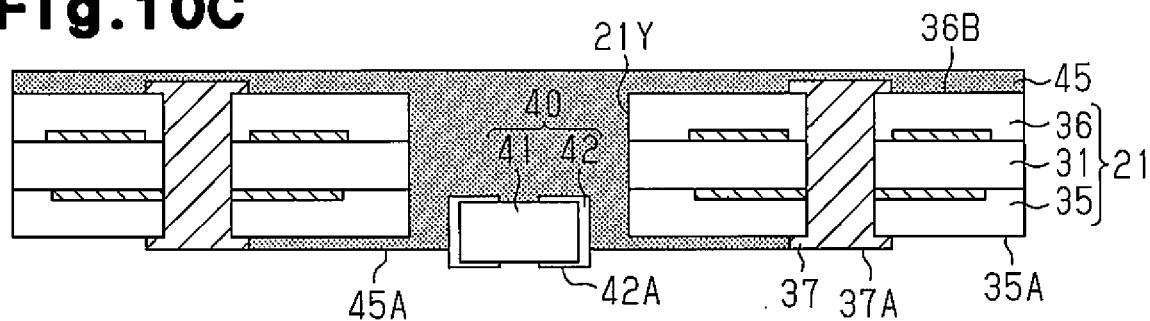

Then, as illustrated in FIG. 10C, the tape 70 is removed from the core 21. This projects and exposes a portion of the chip capacitor 40 toward the lower side from the first surface 45A of the insulating layer 45. For example, the first surface 37A of the wiring layer 37 and the first surface 45A of the insulating layer 45, which come into contact with the upper surface 72A of the adhesive layer 72 in the step of FIG. 10B, are shaped to lie along the upper surface 72A (flat surface) of the adhesive layer 72. Thus, the first surface 37A of the wiring layer 37 and the first surface 45A of the insulating layer 45 are flat and substantially flush with each other. In the present step, among the tape base 71 and the adhesive layer 72, only the tape base 71 is removed in the same manner as the second embodiment.

A roughening process is then performed on the wiring layer 37 and the connection terminal 42 that are exposed from the insulating layers 35 and 45.

Figure 10D:
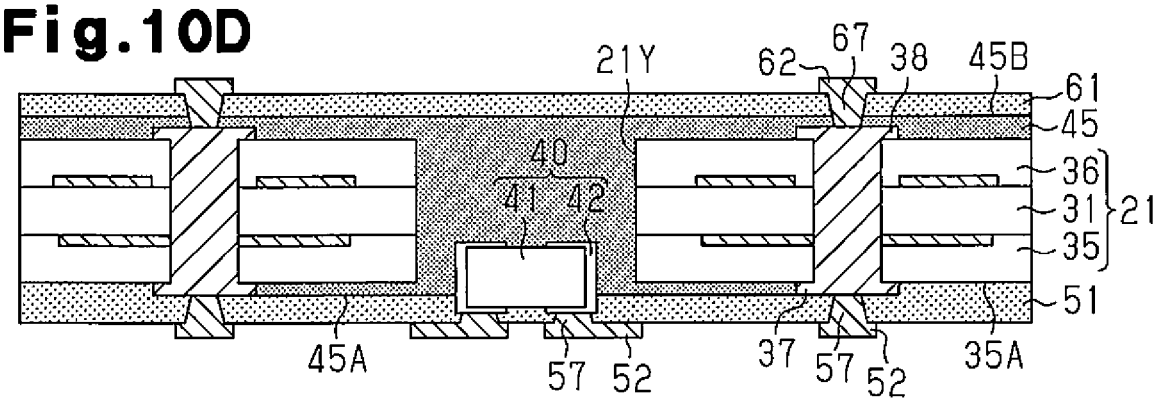

As illustrated in FIG. 10D, in the same manner as the procedure of FIG. 4C, the interlayer insulating layer 51 that covers the first surface 45A of the insulating layer 45 is formed on the first surface 35A of the insulating layer 35. The interlayer insulating layer 51 also covers the wiring layer 37 and the chip capacitor 40 that are exposed from the insulating layer 45. The interlayer insulating layer 61 is also formed covering the second surface 45B of the insulating layer 45. Then, the wiring layer 52, which is connected to the wiring layer 37 or the connection terminal 42 through the via wires 57 extending through the interlayer insulating layer 51 in the thicknesswise direction, is formed in the same manner as the procedures of FIGS. 4D and 4E. At the same time, the wiring layer 62 is formed connected to the wiring layer 38 through the via wires 67 extending through the insulating layer 45 and the interlayer insulating layer 61 in the thicknesswise direction.

Then, the procedures of FIGS. 5A and 5B are performed. This manufactures the semiconductor device of the present modification.

In the above embodiments and modifications, the via wire 57 is formed only on one of the first surface 42A of the first surface 42A and the second surface 42B of each connection terminal 42. Instead, a via wire may be formed, for example, on the first surface 42A and the second surface 42B of each connection terminal 42. Such a wiring substrate may be formed, for example, in the following manner.

Figure 11A:
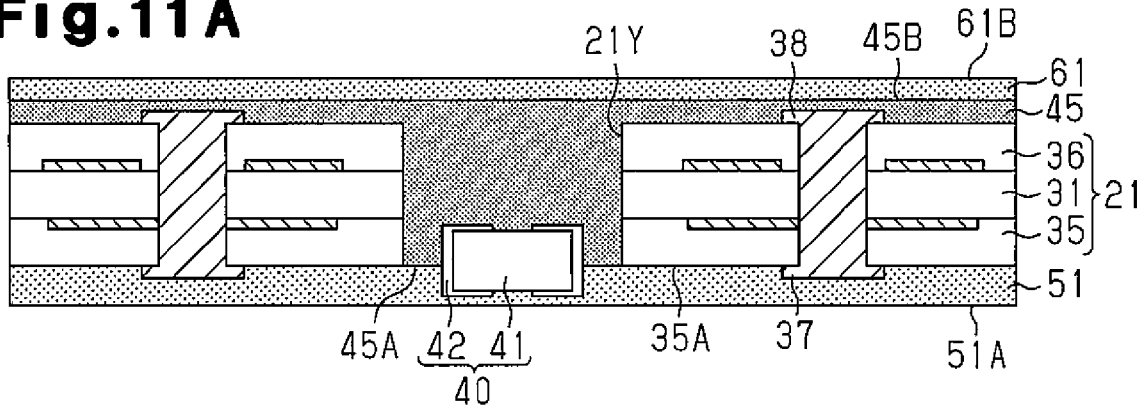
FIGS. 11A to 11C are schematic cross-sectional views illustrating a method for manufacturing a wiring substrate of a fourth modification.

First, as illustrated in FIG. 11A, the procedures of FIGS. 3A to 4C are performed to obtain a structure similar to that of FIG. 4C. More specifically, the interlayer insulating layer 51 is formed to cover the first surfaces 35A and 45A of the insulating layers 35 and 45 and the chip capacitor 40 and the wiring layer 37 exposed from the insulating layers 35 and 45. The interlayer insulating layer 61 is also formed to cover the second surface of the insulating layer 45.

Figure 11B:
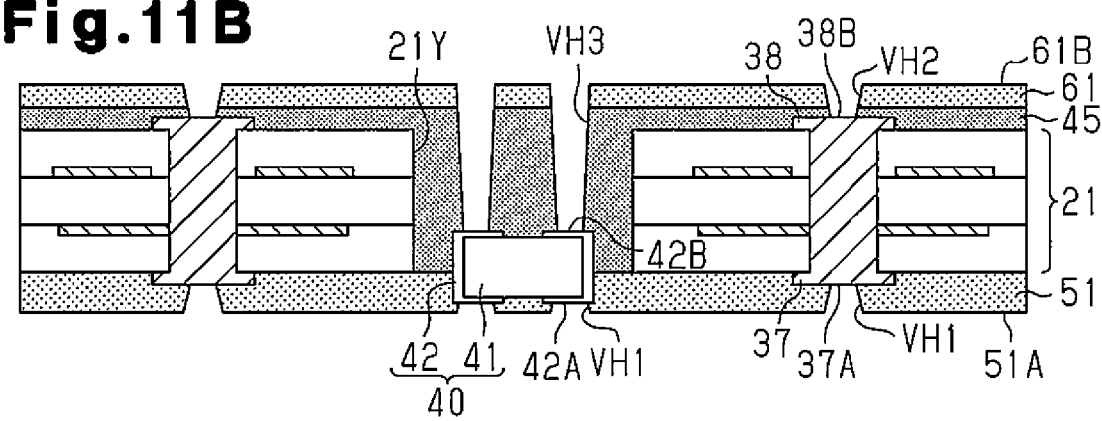

Referring to FIG. 11B, for example, laser processing is performed to form the via holes VH1 at certain locations in the interlayer insulating layer 51 and expose a portions of the first surface 37A of the wiring layer 37 and portions of the first surfaces 42A of the connection terminals 42. Further, for example, laser processing is performed to form the via holes VH2 at certain locations in the insulating layer 45 and the interlayer insulating layer 61 to expose portions of the second surface 38B of the wiring layer 38. Moreover, for example, laser processing is performed to form via holes VH3 that extend through the insulating layer 45 and the interlayer insulating layer 61 at certain locations in the insulating layer 45 (e.g., insulating layer 45 in the cavity 21Y) and the interlayer insulating layer 61 to expose portions of the second surface 42B of the connection terminal 42.

Figure 11C:
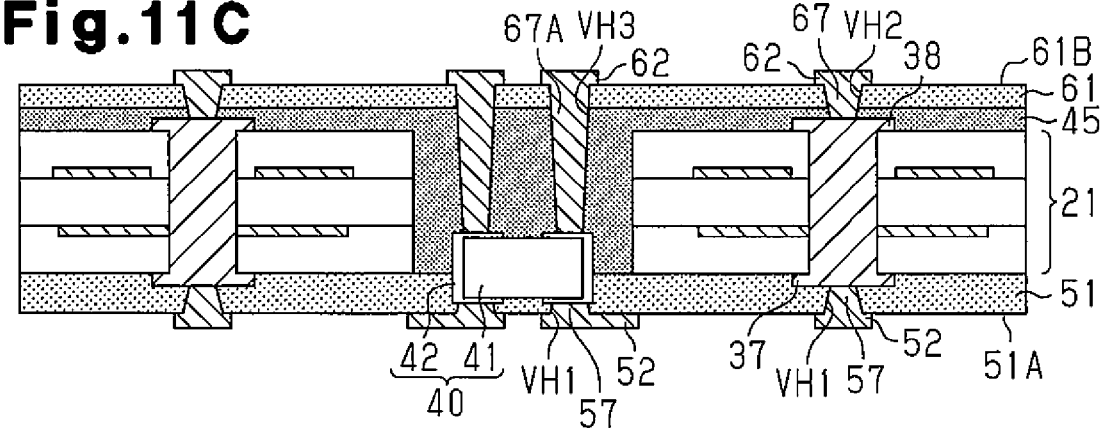

Then, referring to FIG. 11C, for example, a semi-additive process is performed to form the via wire 57 in each via hole VH1, and the wiring layer 52 is formed on the first surface 51A of the interlayer insulating layer 51 and electrically connected to the wiring layer 37 or the connection terminal 42 through the via wires 57. Further, for example, a semi-additive process is performed to form the via wire 67 in each via hole VH2, and the wiring layer 62 is formed on the second surface 61B of the interlayer insulating layer 61 and electrically connected to the wiring layer 38 through the via wires 67. Moreover, for example, a semi-additive process is performed to form the via wire 67A in each via hole VH3, and the wiring layer 62 is formed on the second surface 61B of the interlayer insulating layer 61 and electrically connected to the connection terminals 42 through the via wires 67A.

Then, the procedures of FIGS. 5A and 5B are performed. This manufactures the semiconductor device of the present modification.

In the wiring substrate 20 of the above embodiments and modifications, the chip capacitor 40 is thinner than the core 21. Instead, for example, the chip capacitor 40 may be thicker than the core 21 in the wiring substrate 20. Such a wiring substrate may be formed in the following manner, for example.

Figure 12A:
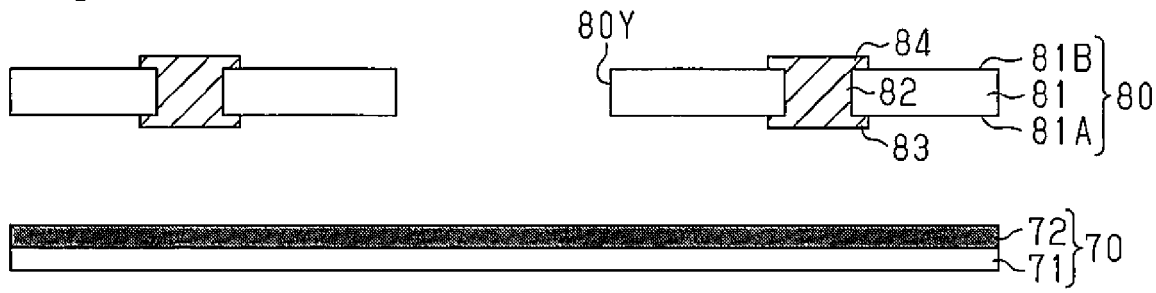
FIGS. 12A to 12D and FIGS. 13A to 13E are schematic cross-sectional views illustrating a method for manufacturing a wiring substrate of a fifth modification.

First, as illustrated in FIG. 12A, a core 80 is prepared. Using the known art, the core 80 is formed including a core substrate 81, through electrodes 82 that extend through the core substrate 81 in a thicknesswise direction, a wiring layer 83 formed on the first surface 81A of the core substrate 81, and a wiring layer 84 formed on the second surface 81B of the core substrate 81 and connected to the wiring layer 83 through the through electrodes 82. Then, a cavity 80Y is formed in the core 80 (core substrate 81) to receive the chip capacitor 40. The cavity 80Y may be formed, for example, by performing router processing, die processing that uses a die, laser processing, drilling, or the like.

As illustrated in FIG. 12A, the tape 70 is arranged on the first surface 81A of the core 80, that is, the first surface 81A of the core substrate 81. The tape 70 is arranged with the adhesive layer 72 facing upward so that the adhesive layer 72 faces the core substrate 81.

Figure 12B:
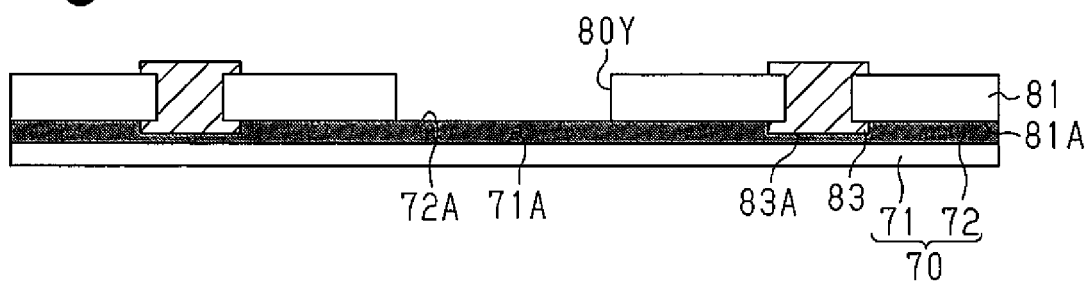

Then, as illustrated in FIG. 12B, the tape 70 is applied to the first surface 81A of the core substrate 81. For example, the sheet-like tape 70 is laminated to the first surface 81A of the core substrate 81 by performing thermal compression bonding. In this case, the wiring layer 83 formed on the first surface 81A of the core substrate 81 is embedded in the adhesive layer 72. The first surface 83A (e.g., lower surface) of the wiring layer 83 is not in contact with the tape base 71.

Figure 12C:
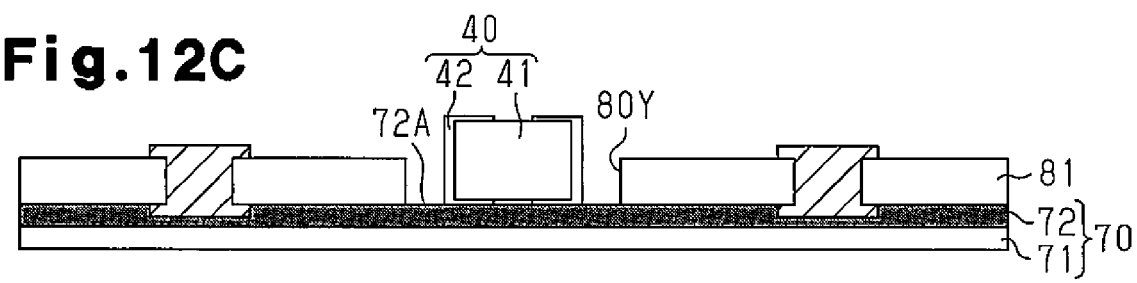

As illustrated in FIG. 12C, for example, the chip capacitor 40 is mounted on the adhesive layer 72 of the tape 70 exposed in the cavity 80Y of the core 80 using a mounter, for example.

Figure 12D:
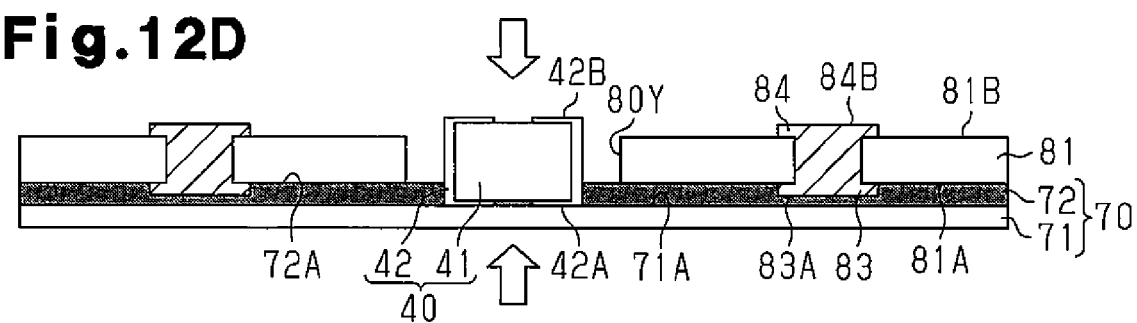

Then, as illustrated in FIG. 12D, the chip capacitor 40 is pushed against the tape 70 (adhesive layer 72) so that a portion of the chip capacitor 40 is buried in the adhesive layer 72. In the present step, the chip capacitor 40 is pushed against the tape 70 until the first surface 42A (e.g., lower surface) of each connection terminal 42 contacts the upper surface 71A of the tape base 71. Thus, the chip capacitor 40 projects toward the lower side from the first surface 81A of the core substrate 81. Further, the chip capacitor 40 projects toward the lower side from the first surface 83A (e.g., lower surface) of the wiring layer 83. The chip capacitor 40 of the present example includes a portion in the vicinity of the second surface 42B (e.g., upper surface) projecting toward the upper side from the cavity 80Y. For example, the chip capacitor 40 projects toward the upper side from the second surface 81B of the core substrate 81. The chip capacitor 40 also projects toward the upper side from the second surface 84B (e.g., upper surface) of the wiring layer 84.

Figure 13A:
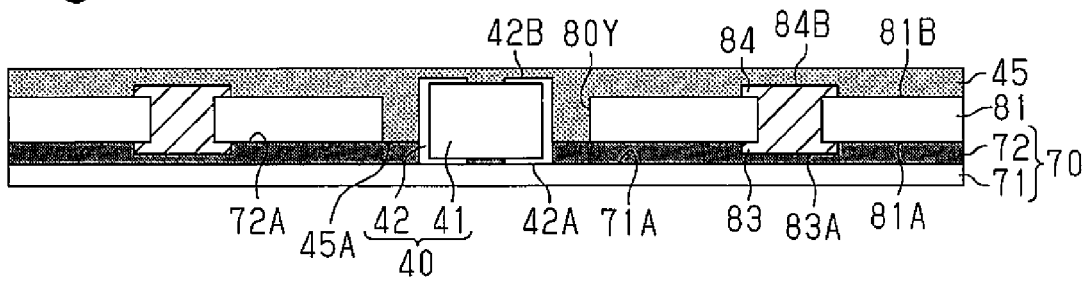

Then, as illustrated in FIG. 13A, the insulating layer 45 that fills the cavity 80Y and covers the wiring layer 84 and the chip capacitor 40, which projects toward the upper side from the cavity 80Y is formed by performing, for example, vacuum lamination or vacuum pressing. The chip capacitor 40 exposed from the adhesive layer 72 (i.e., chip capacitor 40 arranged in the cavity 80Y and chip capacitor 40 projecting toward the upper side from the cavity 80Y) is entirely covered by the insulating layer 45. In other words, the chip capacitor 40 exposed from the adhesive layer 72 is buried in the insulating layer 45. Thus, even if a portion of the chip capacitor 40 projects toward the upper side from the second surface 81B of the core substrate 81, the projecting chip capacitor 40 may be buried in the insulating layer 45, and the insulating layer 45 may absorb the thickness of the projecting amount.

Figure 13B:
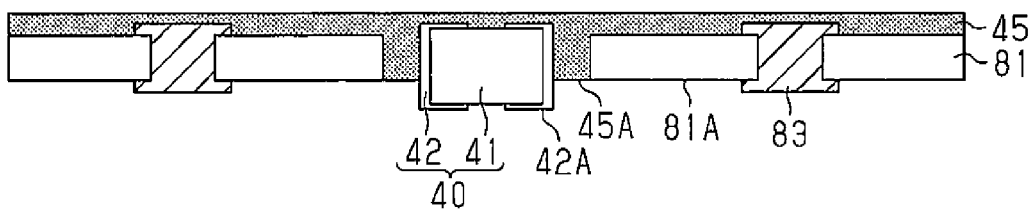

Then, as illustrated in FIG. 13B, the tape 70 (tape base 71 and adhesive layer 72) is removed from the core 80. In this case, the adhesive layer 72 is not in contact with the first surface 42A of each connection terminal 42 in the preceding step. This prevents or reduces the formation of an adhesive deposit in the first surface 42A. Further, the first surface 81A of the core substrate 81 and the first surface 45A of the insulating layer 45 that were in contact with the upper surface 72A of the adhesive layer 72 are flat and substantially flush with each other.

A roughening process is then performed on the wiring layer 83 and the connection terminals 42, which are exposed from the core substrate 81 and the insulating layer 45.

Figure 13C:
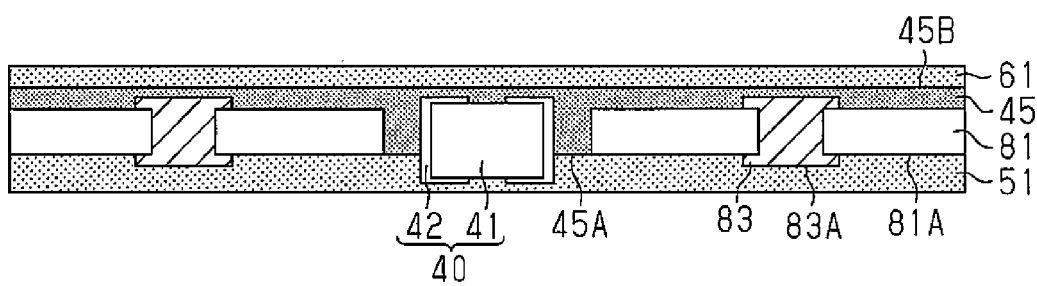

As illustrated in FIG. 13C, the interlayer insulating layer 51 is formed to cover the entire first surface 81A of the core substrate 81, the entire first surface 45A of the insulating layer 45, the first surface 83A and the side surfaces of the wiring layer 83, and the entire surface of the chip capacitor 40 exposed from the insulating layer 45 is formed. The interlayer insulating layer 61 is also formed to cover the entire second surface 45B of the insulating layer 45.

Figure 13D:
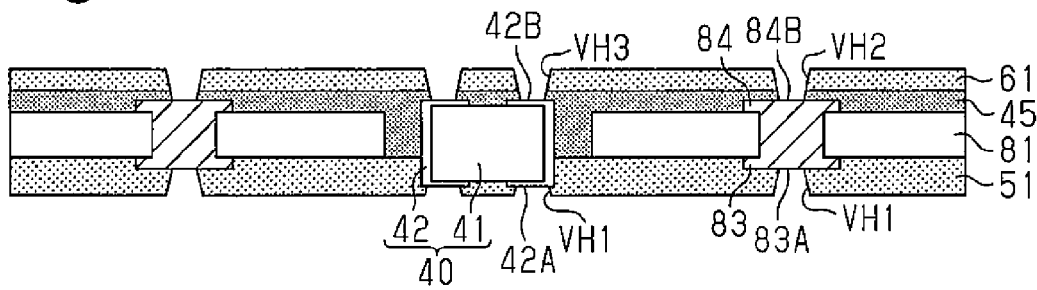

Then, referring to FIG. 13D, for example, laser processing is performed to form the via holes VH1 at certain locations in the interlayer insulating layer 51 to expose portions in the first surface 83A of the wiring layer 83 or portions of the first surfaces 42A of the connection terminals 42. Further, for example, laser processing is performed to form the via holes VH2, which extend through the insulating layer 45 and the interlayer insulating layer 61, at certain locations in the insulating layer 45 and the interlayer insulating layer 61 to expose the second surface 84B of the wiring layer 84. Moreover, for example, laser processing is performed to form the via holes VH3, which extend through the insulating layer 45 and the interlayer insulating layer 61 at certain locations in the insulating layer 45 and the interlayer insulating layer 61 to expose the second surface 42B of the connection terminal 42.

Figure 13E:
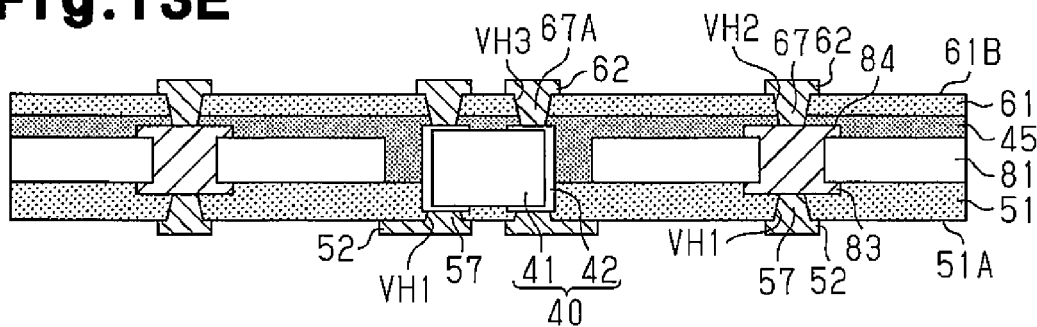

Then, referring to FIG. 13E, for example, a semi-additive is performed to form the wiring layer 52 connected to the wiring layer 83 or the connection terminal 42 through the via wires 57, which extend through the interlayer insulating layer 51 in the thicknesswise direction. For example, a semi-additive process is performed to form the wiring layer 62, which is connected to the wiring layer 84 through the via wires 67 extending through the insulating layer 45 and the interlayer insulating layer 61 in the thicknesswise direction, and the wiring layer 62, which is connected to the connection terminal 42 through the via wires 67A extending through the insulating layer 45 and the interlayer insulating layer 61 in the thicknesswise direction.

Figure 14A:
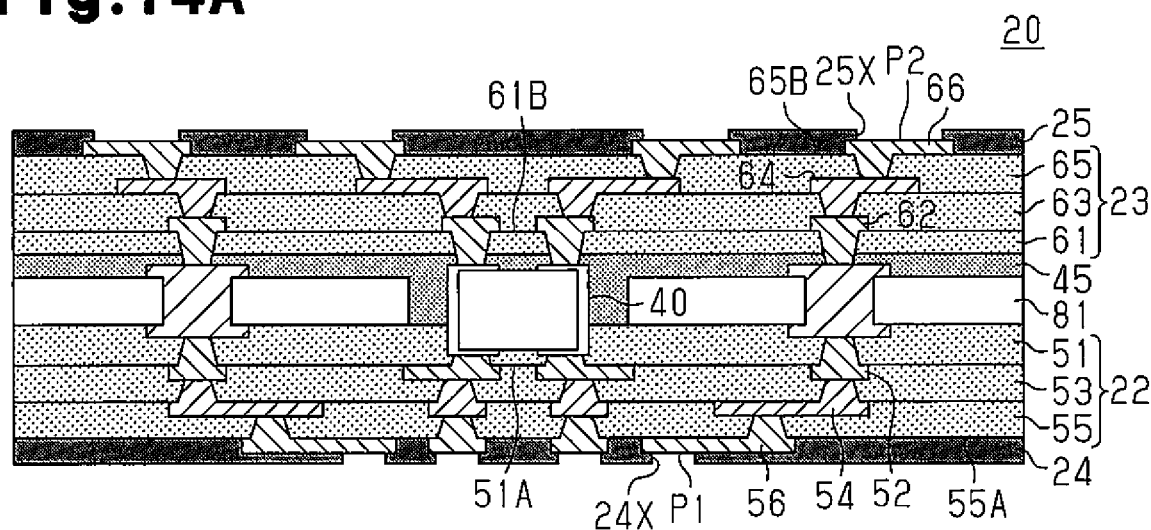
FIG. 14A is a schematic cross-sectional view of the wiring substrate of the fifth modification.

As illustrated in FIG. 14A, the procedures of FIGS. 13C to 13E are repeated to alternately stack the interlayer insulating layers 53 and 55 and the wiring layers 54 and 56 on the first surface 51A of the interlayer insulating layer 51, and alternately stack the interlayer insulating layers 63 and 65 and the wiring layers 64 and 66 on the second surface 61B of the interlayer insulating layer 61. The solder resist layer 24 including the openings 24X is then stacked on the first surface 55A of the interlayer insulating layer 55. Further, the solder resist layer 25 including the openings 25X is stacked on the second surface 65B of the interlayer insulating layer 65. The above manufacturing steps manufacture the wiring substrate 20.

Figure 14B:
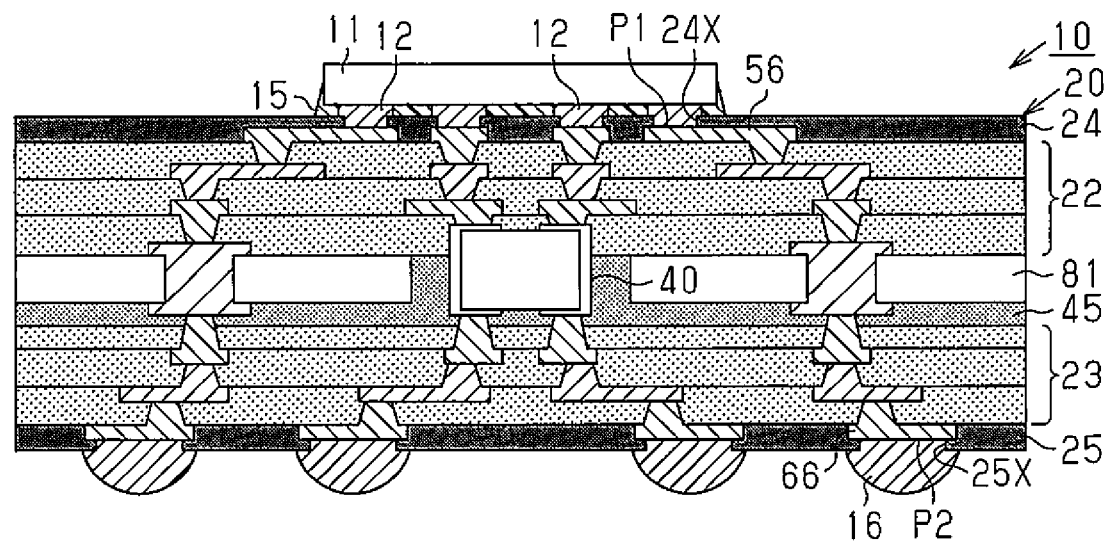
FIG. 14B is a schematic cross-sectional view of a semiconductor device including the wiring substrate of the fifth modification.
Figure 15A:
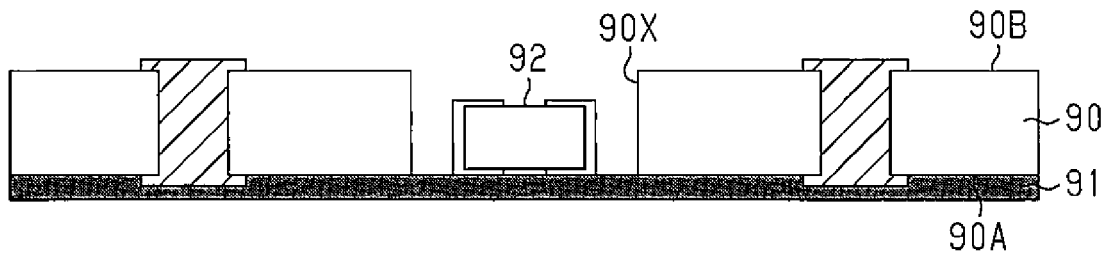
FIGS. 15A to 15D are schematic cross-sectional views illustrating a method for manufacturing a conventional wiring substrate.
Figure 15B:
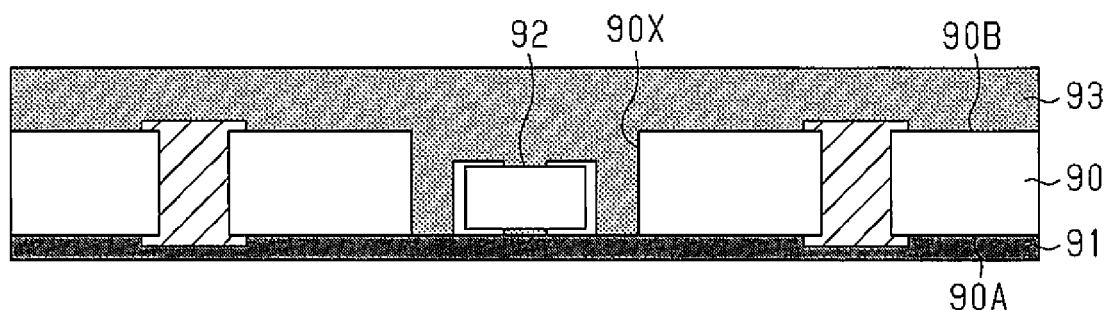
Figure 15C:
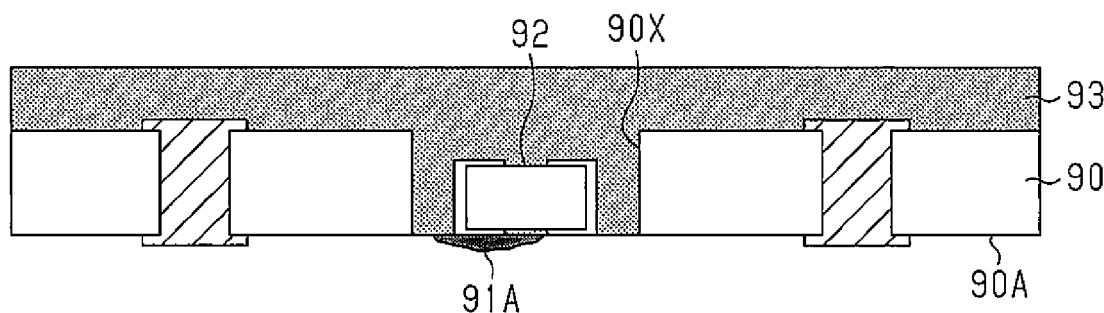
Figure 15D:
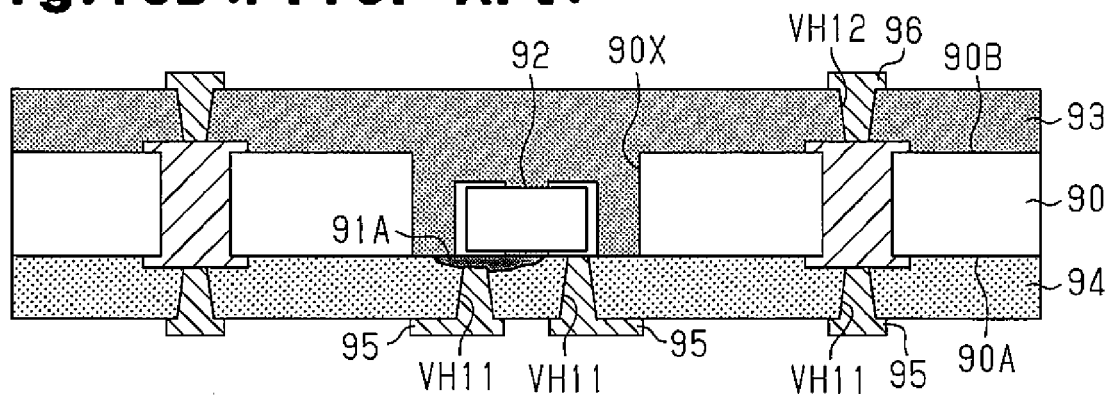

As illustrated in FIG. 14B, the semiconductor chip 11 is flip-chip mounted on the wiring substrate 20, which is manufactured as described above. The underfill resin 15 is formed between the wiring substrate 20 and the semiconductor chip 11. The external connection terminals 16 are formed on the external connection pads P2. The above manufacturing step manufactures the semiconductor device 10.

In the above embodiments and modifications, the chip capacitor 40 including the two connection terminals 42 is incorporated in the wiring substrate 20. Instead, for example, an electronic component such as a capacitor including three or more connection terminals 42 may be incorporated in the wiring substrate 20.

In the above embodiments and modifications, the chip capacitor 40 is incorporated in the wiring substrate 20. However, an electronic component such as a chip resistor, an inductor, a semiconductor device (LSI), and the like may be incorporated in the wiring substrate 20.

In the above embodiments and modifications, one electronic component (chip capacitor 40) is incorporated in the wiring substrate 20. Instead, a wiring substrate may incorporate, for example, two or more electronic components. Further, more than one type of electronic component may be incorporated in the same wiring substrate.

In the above embodiments and the modifications, the structure of the core 21 at the inner side of the outermost wiring layers 37 and 38 is not particularly limited. In the same manner, the structure of the core 80 at the inner side of the outermost wiring layers 83 and 84 is not particularly limited. In other words, the structure of the cores 21 and 80 at the inner side of the outermost wiring layers is not particularly limited as long as at least the outermost wiring layers 37 and 38 (wiring layers 83 and 84) are electrically connected to each other through the interior of the substrate and the cavity 21Y (80Y) is formed. For example, the structure and the material of the core substrates 31 and 81 are not particularly limited. The number of wiring layers and insulating layers, the layout of the wiring, and the like at the inner side of the cores 21 and 80 may be changed in various manners. Alternatively, the core 21 may be a coreless substrate that does not include the core substrate 31.

In the above embodiments and modifications, the through electrodes 39 are formed to fill the through holes 21X. Instead, for example, the through electrodes 39 may be formed as conformal vias. In other words, the shape of the through electrode 39 is not particularly limited as long as the through electrode 39 covers the wall surface in each through hole 21X and electrically connects the wiring layers 37 and 38 respectively formed on the first surface 35A and the second surface 36B of the core 21. Similar changes may also be made to the through electrode 82.

The number of the wiring layers 52, 54, and 56 and the interlayer insulating layers 51, 53, and 55, the wiring layout, and the like in the wiring structure 22 of the above embodiments and modifications may be changed in various manners.

The number of wiring layers 62, 64, and 66 and the interlayer insulating layers 61, 63, and 65, the wiring layout, and the like in the wiring structure 23 of the above embodiments and modifications may be changed in various manners.

The cavities 21Y and 80Y of the cores 21 and 80 in the above embodiments and modifications is formed to have substantially rectangular cross-sections. Instead, for example, the cavities 21Y and 80Y may be formed to have substantially trapezoidal cross-sections in the same manner as the via holes VH1 and the like. Further, the cavities 21Y and 80Y may be formed to have substantially drum-shaped cross-sections.

The above embodiments and modifications are embodied in a method for manufacturing a single semiconductor device but may be embodied in a method for manufacturing a batch of semiconductor devices.

Changes may be made to the number of semiconductor chips on the wiring substrate 20 of the semiconductor device 10 in the above embodiments and modifications and the mounting mode of the semiconductor chip (e.g., flip-chip mounting, wire bonding, or a combination of flip-chip mounting and wire bonding) and the like.

In the illustrated embodiments, the wiring layers 37 and 83 are examples of a first wiring layer. The wiring layers 38 and 84 are examples of a second wiring layer. The chip capacitor 40 is one example of an electronic component. The insulating layer 45 is one example of a first insulating layer. The interlayer insulating layer 51 is one example of a third insulating layer or a fifth insulating layer. The wiring layer 52 is one example of a third wiring layer. The via wire 57 is one example of a first via wire. The interlayer insulating layer 61 is one example of a second insulating layer. The wiring layer 62 is one example of a fourth wiring layer. The via wire 67 is one example of a second via wire. The insulating layer 73 is one example of a fourth insulating layer.

This disclosure further encompasses various embodiments described below.

[Clause 1] According to one embodiment, a manufacturing method of a wiring substrate includes: forming a cavity that extends through a core including a first surface, a second surface, a first wiring layer, and a second wiring layer, wherein the second surface is located at an opposite side of the first surface, the first wiring layer is formed on the first surface, and the second wiring layer is formed on the second surface; applying a tape including an adhesive layer and a tape base to the first surface of the core to cover an opening; burying a portion of an electronic component in the adhesive layer of the tape that is exposed in the cavity; forming a first insulating layer to cover the electronic component, which is arranged in the cavity, and the second surface of the core and to fill the cavity; removing the tape from the core, wherein the electronic component includes a portion projected from a first opening of the cavity and exposed from the first insulating layer; forming a second insulating layer that covers the first insulating layer, which covers the second surface of the core; forming a third insulating layer that covers the first surface of the core and the projected and exposed portion of the electronic component; forming a first through hole, which extends through the third insulating layer, and a second through hole, which extends through the first insulating layer and the second insulating layer; forming a first via wire in the first through hole and a third wiring layer on the third insulating layer to electrically connect the electronic component and the third wiring layer through the first via wire; and forming a second via wire in the second through hole and a fourth wiring layer on the second insulating layer to electrically connect the second wiring layer and the fourth wiring layer through the second via wire.

[Clause 2] In the method according to clause 1, it is preferable that a thickness of the third insulating layer over the first wiring layer is equal to a total thickness of the first insulating layer and the second insulating layer over the second wiring layer.

[Clause 3] In the method according to clause 1, it is preferable that the burying a portion of an electronic component in the adhesive layer includes burying the electronic component in the adhesive layer so that a connection terminal of the electronic component contacts the tape base.

[Clause 4] According to one embodiment, a manufacturing method of a wiring substrate includes: forming a cavity that extends through a core including a first surface, a second surface, a first wiring layer, and a second wiring layer, wherein the second surface is located at an opposite side of the first surface, the first wiring layer is formed on the first surface, and the second wiring layer is formed on the second surface; applying a tape including an adhesive layer and a tape base to the first surface of the core to cover the cavity; burying a portion of an electronic component in the adhesive layer of the tape that is exposed in the cavity; forming a first insulating layer to cover the electronic component, which is arranged in the cavity, and the second surface of the core and to fill the cavity; removing only the tape base of the tape from the core so that the adhesive layer remains on the core, wherein the electronic component includes a portion projected from a first opening of the cavity and exposed from the adhesive layer; forming a second insulating layer that covers the first insulating layer, which covers the second surface of the core; forming a fifth insulating layer that covers the adhesive layer and the projected and exposed portion of the electronic component; forming a first through hole, which extends through the adhesive layer and the fifth insulating layer, and a second through hole, which extends through the first insulating layer and the second insulating layer; forming a first via wire in the first through hole and a third wiring layer on the fifth insulating layer to electrically connect the electronic component and the third wiring layer through the first via wire; and forming a second via wire in the second through hole and a fourth wiring layer on the second insulating layer to electrically connect the second wiring layer and the fourth wiring layer through the second via wire.

[Clause 5] In the method according to clause 4, it is preferable that a thickness of the fifth insulating layer and the adhesive layer over the first wiring layer is equal to a total thickness of the first insulating layer and the second insulating layer over the second wiring layer.

[Clause 6] In the method according to clause 4, it is preferable that the burying a portion of an electronic component in the adhesive layer includes burying the electronic component in the adhesive layer so that a connection terminal of the electronic component contacts the tape base.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
   a core including a first surface, a second surface, and a cavity, wherein the second surface is located at an opposite side of the first surface, and the cavity includes a first opening and a second opening in the first surface and the second surface, respectively;
   a first wiring layer formed on the first surface of the core;
   a second wiring layer formed on the second surface of the core;
   an electronic component arranged in the cavity;
   a first insulating layer that fills the cavity and covers the second surface of the core, wherein the electronic component is partially buried in the first insulating layer, and the electronic component includes a portion projected from the first opening of the cavity and exposed from the first insulating layer;
   a second insulating layer that covers the first insulating layer;
   a third insulating layer that covers the first surface of the core and the projected and exposed portion of the electronic component;
   a first via wire that extends through the third insulating layer;
   a third wiring layer formed on the third insulating layer and electrically connected to the electronic component through the first via wire;
   a second via wire that extends through the second insulating layer and the first insulating layer; and
   a fourth wiring layer formed on the second insulating layer and electrically connected to the second wiring layer through the second via wire;
   wherein a thickness of the third insulating layer over the first wiring layer is equal to a total thickness of the first insulating layer and the second insulating layer over the second wiring layer.

2. The wiring substrate according to claim 1, wherein the third insulating layer includes
   a fourth insulating layer that covers the first surface of the core and at least partially covers the projected and exposed portion of the electronic component, and
   a fifth insulating layer that covers the fourth insulating layer.

3. The wiring substrate according to claim 2, wherein the fourth insulating layer is adhered to the core by a stronger adhesive force than the first insulating layer.

4. The wiring substrate according to claim 1, wherein
   the projected and exposed portion of the electronic component includes a rough surface which has a higher surface roughness than a surface of the electronic component that excludes the projected and exposed portion.

5. The wiring substrate according to claim 1, wherein the projected and exposed portion of the electronic component projects higher than the first wiring layer.

6. The wiring substrate according to claim 1, wherein a thickness of the third insulating layer between the first wiring layer and the third wiring layer is equal to a total thickness of the first insulating layer and the second insulating layer between the second wiring layer and the fourth wiring layer.

* * * * *